US012672439B2

(12) United States Patent
He et al.

(10) Patent No.: US 12,672,439 B2
(45) Date of Patent: Jun. 30, 2026

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Qing He, Beijing (CN); Shilong Wang, Beijing (CN); Mengqi Wang, Beijing (CN); Wenbo Chen, Beijing (CN); Qingqing Yan, Beijing (CN); Ge Wang, Beijing (CN); Zhiliang Jiang, Beijing (CN); Fang Fang, Beijing (CN); Xiaomin Yuan, Beijing (CN)

(73) Assignees: CHENGDU BOE OPTOELECTRONICS TECHNOLOGY CO., LTD., Sichuan (CN); BCE TECHNOLOGY GROUP CO., LTD., Beijing (CN)

( * ) Notice: Subject to any disclaimer, the term of this patent is extended or adjusted under 35 U.S.C. 154(b) by 393 days.

(21) Appl. No.: 18/567,143

(22) PCT Filed: Feb. 28, 2023

(86) PCT No.: PCT/CN2023/078868
§ 371 (c)(1),
(2) Date: Dec. 5, 2023

(87) PCT Pub. No.: WO2024/178648
PCT Pub. Date: Sep. 6, 2024

(65) Prior Publication Data
US 2025/0089474 A1 Mar. 13, 2025

(51) Int. Cl.
*H10K 59/124* (2023.01)
*H10K 59/131* (2023.01)
*H10K 59/80* (2023.01)

(52) U.S. Cl.
CPC ......... *H10K 59/124* (2023.02); *H10K 59/131* (2023.02); *H10K 59/873* (2023.02)

(58) Field of Classification Search
CPC ... H10K 59/873; H10K 59/131; H10K 59/124
See application file for complete search history.

(56) References Cited

U.S. PATENT DOCUMENTS 10,170,534 B1 1/2019 Kim et al.
2017/0365814 A1 12/2017 Kim et al.
(Continued)

FOREIGN PATENT DOCUMENTS

CN 107527551 A 12/2017
CN 109509771 A 3/2019
(Continued)

*Primary Examiner* — Dale E Page
*Assistant Examiner* — Wilner Jean Baptiste
(74) *Attorney, Agent, or Firm* — XSENSUS LLP

(57) ABSTRACT

Provided is a display panel. The display panel includes: a base substrate having a display region and a peripheral region surrounding the display region; a plurality of pixel units disposed in the display region and including a light-emitting unit; a barrier structure disposed in the peripheral region and surrounding the plurality of pixel units; a connecting structure disposed in the peripheral region; a first insulating layer disposed between the first electrode layer and the base substrate, wherein a via hole is formed in a portion of the first insulating layer in the peripheral region; a circuit structure disposed in the peripheral region and including a first circuit structure; a second insulating layer disposed on a side of the second metal layer; and a third insulating layer disposed on a side of the second insulating layer and including a body pattern.

20 Claims, 14 Drawing Sheets

(56)          References Cited

U.S. PATENT DOCUMENTS

| | | | |
|---|---|---|---|
| 2021/0202895 A1 | 7/2021 | Kang et al. | |
| 2021/0225992 A1 | 7/2021 | Long et al. | |
| 2021/0242284 A1* | 8/2021 | Kim ..................... | G06F 3/0412 |
| 2024/0049532 A1 | 2/2024 | Li et al. | |
| 2024/0049565 A1 | 2/2024 | Hu et al. | |
| 2024/0172508 A1 | 5/2024 | Xu et al. | |

FOREIGN PATENT DOCUMENTS

| | | | |
|---|---|---|---|
| CN | 111863922 | A | 10/2020 |
| CN | 113130541 | A | 7/2021 |
| CN | 113471225 | B | 11/2021 |
| CN | 114284325 | A | 4/2022 |
| CN | 115485851 | A | 12/2022 |
| KR | 2018-0013225 | A | 2/2018 |
| WO | 2021/017011 | A1 | 2/2021 |

* cited by examiner

DISPLAY PANEL AND DISPLAY DEVICE

CROSS-REFERENCE TO RELATED APPLICATION

This application is a U.S. national stage of international application No. PCT/CN2023/078868, filed on Feb. 28, 2023, the disclosure of which is incorporated herein by reference in its entirety.

TECHNICAL FIELD

The present disclosure relates to the field of display technologies, and in particular, to a display panel and a display device.

BACKGROUND

A display panel generally has a display region and a peripheral region surrounding the display region. The display panel generally includes a plurality of pixel units disposed in the display region, a drive circuit disposed in the peripheral region and configured to provide drive signals for the pixel units, and a power line disposed in the peripheral region and configured to provide a negative power signal for a cathode layer of the display panel. The negative power signal is generally referred to as a VSS signal, and the power line is generally referred to as a VSS trace.

SUMMARY

The present disclosure provides a display panel and a display device. The technical solutions are as follows.

In some embodiments of the present disclosure, a display panel is provided. The display panel includes:

a base substrate having a display region and a peripheral region surrounding the display region;

a plurality of pixel units disposed in the display region, wherein the pixel unit includes a light-emitting unit, and the light-emitting unit includes a first electrode layer, a light-emitting layer and a second electrode layer which are stacked in sequence;

a barrier structure disposed in the peripheral region, wherein the barrier structure surrounds the plurality of pixel units;

a connecting structure disposed in the peripheral region, wherein the connecting structure and the first electrode layer are disposed in a same layer and are spaced apart from each other, and the connecting structure is electrically connected to the second electrode layer;

a first insulating layer disposed between the first electrode layer and the base substrate, wherein a via hole is formed in a portion of the first insulating layer which is disposed in the peripheral region;

a circuit structure disposed in the peripheral region, wherein the circuit structure includes a first circuit structure disposed in a region enclosed by the barrier structure, and the first circuit structure includes a first circuit sub-pattern and a second circuit sub-pattern, wherein the first circuit sub-pattern is disposed in a first metal layer, the second circuit sub-pattern is disposed in a second metal layer, the first metal layer and the second metal layer are disposed on two sides of the first insulating layer, the via hole in the first insulating layer includes a first via hole, and the first circuit sub-pattern and the second circuit sub-pattern are electrically connected to each other through the first via hole;

a second insulating layer disposed on a side of the second metal layer away from the base substrate; and a third insulating layer disposed on a side of the second insulating layer away from the base substrate, wherein the third insulating layer includes a body pattern disposed in the display region and the peripheral region, and the body pattern includes a third side surface disposed in the peripheral region, wherein an orthographic projection of the third side surface on the base substrate is within an orthographic projection of the barrier structure on the base substrate, and portions of the body pattern which are disposed in the peripheral region are continuous patterns on a side of the third side surface close to the display region.

In some embodiments, the barrier structure includes a first barrier dam and a second barrier dam, wherein the first barrier dam is closer to the plurality of pixel units than the second barrier dam is, and a thickness of the first barrier dam is less than a thickness of the second barrier dam;

the connecting structure has a first side surface and a second side surface opposite to each other, wherein the first side surface is closer to the plurality of pixel units than the second side surface is;

wherein an orthographic projection of the second side surface on the base substrate is within an orthographic projection of the first barrier dam on the base substrate, and an orthographic projection of the connecting structure on the base substrate is not overlapped with an orthographic projection of the second barrier dam on the base substrate.

In some embodiments, the circuit structure further includes a second circuit structure disposed between the first barrier dam and the second barrier dam; wherein the second circuit structure includes a third circuit sub-pattern and a fourth circuit sub-pattern, wherein the third circuit sub-pattern is disposed in the first metal layer, the fourth circuit sub-pattern is disposed in the second metal layer, the via hole in the first insulating layer includes a second via hole, and the third circuit sub-pattern and the fourth circuit sub-pattern are electrically connected to each other through the second via hole.

In some embodiments, the barrier structure includes a first barrier dam and a second barrier dam, wherein the first barrier dam is closer to the plurality of pixel units than the second barrier dam is, and a thickness of the first barrier dam is less than a thickness of the second barrier dam;

the connecting structure has a first side surface and a second side surface opposite to each other, and the first side surface is closer to the plurality of pixel units than the second side surface is;

wherein an orthographic projection of the second side surface on the base substrate is within an orthographic projection of the second barrier dam on the base substrate, and an orthographic projection of the connecting structure on the base substrate is overlapped with an orthographic projection of the first barrier dam on the base substrate.

In some embodiments, the circuit structure further includes a second circuit structure disposed between the first barrier dam and the second barrier dam; wherein the second circuit structure includes a third circuit sub-pattern and a fourth circuit sub-pattern, the via hole in the first insulating layer includes a second via hole, and the third circuit sub-pattern and the fourth circuit sub-pattern are electrically connected to each other through the second via hole;

3

4 the display panel further includes: a protection layer disposed on the base substrate, wherein the protection layer includes a plurality of protection patterns, and an orthographic projection of the protection pattern on the base substrate covers an orthographic projection of the second via hole on the base substrate.

In some embodiments, the plurality of protection patterns are disposed in the third insulating layer.

In some embodiments, the protection layer is a third metal layer disposed on a side of the second insulating layer away from the base substrate; wherein a plurality of metal patterns included in the third metal layer are the plurality of protection patterns, wherein an orthographic projection of the metal pattern on the base substrate covers the orthographic projection of the second via hole on the base substrate.

In some embodiments, the protection layer is an active layer disposed between the base substrate and the first metal layer; wherein a plurality of active patterns included in the active layer are the plurality of protection patterns, wherein an orthographic projection of the active pattern on the base substrate covers the orthographic projection of the second via hole on the base substrate.

In some embodiments, the protection layer is a light-shielding layer disposed between the base substrate and the first metal layer; wherein a plurality of light-shielding patterns included in the light-shielding layer are the plurality of protection patterns, wherein an orthographic projection of the light-shielding pattern on the base substrate covers the orthographic projection of the second via hole on the base substrate.

In some embodiments, a difference value obtained by subtracting an area of the orthographic projection of the second via hole on the base substrate from an area of the orthographic projection of the protection pattern on the base substrate ranges from 1 square micron to 50 square microns.

In some embodiments, a plurality of second via holes are defined in the first insulating layer, wherein the plurality of second via holes include a plurality of target second via holes, and orthographic projections of the plurality of target second via holes on the base substrate are covered by the orthographic projection of the same protection pattern on the base substrate;

wherein a spacing between any target second via hole and another target second via hole of the plurality of target second via holes is less than 4 μm.

In some embodiments, the circuit structure further includes a second circuit structure disposed between the first barrier dam and the second barrier dam; wherein the second circuit structure includes a third circuit sub-pattern and a fourth circuit sub-pattern, the via hole in the first insulating layer includes a second via hole, and the third circuit sub-pattern and the fourth circuit sub-pattern are electrically connected to each other through the second via hole;

the connecting structure is provided with a plurality of openings, wherein an orthographic projection of the opening on the base substrate covers an orthographic projection of the second via hole on the base substrate.

In some embodiments, a difference value obtained by subtracting an area of the orthographic projection of the second via hole on the base substrate from an area of the orthographic projection of the opening on the base substrate ranges from 1 square micron to 50 square microns.

In some embodiments, a plurality of second via holes include a plurality of target second via holes, and orthographic projections of the plurality of target second via holes on the base substrate are covered by the orthographic projection of the same opening on the base substrate;

wherein a spacing between any target second via hole and another target second via hole of the plurality of target second via holes is less than 4 μm.

In some embodiments, the third insulating layer further includes a first insulating pattern; and the display panel further includes a fourth insulating layer disposed on a side of the third insulating layer away from the base substrate, and the fourth insulating layer includes a second insulating pattern and a third insulating pattern; wherein the first barrier dam at least includes the second insulating pattern, and the second barrier dam at least includes the first insulating pattern and the third insulating pattern which are stacked in a direction going away from the base substrate.

In some embodiments, an edge away from the display region of an orthographic projection of the connecting structure on the base substrate is closer to the display region than an edge away from the display region of the orthographic projection of the barrier structure on the base substrate is;

an orthographic projection of the body pattern on the base substrate is not overlapped with an orthographic projection of the second barrier dam on the base substrate.

In some embodiments, the display panel further includes: at least one first power line; wherein the at least one first power line is disposed in the peripheral region, and the at least one first power line includes a first portion and a second portion; wherein the first portion is disposed on a side of the barrier structure away from the plurality of pixel units and is configured to receive a first power signal, and the second portion surrounds the plurality of pixel units and is electrically connected to the first portion and the connecting structure.

In some embodiments of the present disclosure, a display panel is provided. The display panel includes:

a base substrate having a display region and a peripheral region surrounding the display region;

a plurality of pixel units disposed in the display region, wherein the pixel unit includes a light-emitting unit, and the light-emitting unit includes a first electrode layer, a light-emitting layer and a second electrode layer which are stacked in sequence;

a barrier structure disposed in the peripheral region, wherein the barrier structure surrounds the plurality of pixel units;

a connecting structure disposed in the peripheral region, wherein the connecting structure and the first electrode layer are disposed in a same layer and are spaced apart from each other, and the connecting structure is electrically connected to the second electrode layer;

a first insulating layer disposed between the first electrode layer and the base substrate, wherein a via hole is formed in a portion of the first insulating layer which is disposed in the peripheral region;

a circuit structure disposed in the peripheral region, wherein the circuit structure includes a first circuit structure disposed between the barrier structure and the display region, and the first circuit structure includes a first circuit sub-pattern and a second circuit sub-pattern, wherein the first circuit sub-pattern is disposed in a first metal layer, the second circuit sub-pattern is disposed in a second metal layer, the first metal layer and the second metal layer are disposed on two sides of the first insulating layer, the via hole in the first insulating layer includes a first via hole, and the first circuit sub-pattern and the second circuit sub-pattern are electrically connected to each other through the first via hole;

a second insulating layer disposed on a side of the second metal layer away from the base substrate; and a third insulating layer disposed on a side of the second insulating layer away from the base substrate, wherein the third insulating layer includes a body pattern disposed in the display region and the peripheral region, and the body pattern includes a third side surface disposed in the peripheral region, wherein an orthographic projection of the third side surface on the base substrate is between the barrier structure and the display region; and a protection layer disposed on the base substrate, wherein the protection layer includes a plurality of protection patterns, wherein an orthographic projection of the protection pattern on the base substrate covers an orthographic projection of the first via hole on the base substrate.

In some embodiments of the present disclosure, a display panel is provided. The display panel includes:

a base substrate having a display region and a peripheral region surrounding the display region;

a plurality of pixel units disposed in the display region, wherein the pixel unit includes a light-emitting unit, and the light-emitting unit includes a first electrode layer, a light-emitting layer and a second electrode layer which are stacked in sequence;

a barrier structure disposed in the peripheral region, wherein the barrier structure surrounds the plurality of pixel units;

a connecting structure disposed in the peripheral region, wherein the connecting structure and the first electrode layer are disposed in a same layer and are spaced apart from each other, and the connecting structure is electrically connected to the second electrode layer;

a first insulating layer disposed between the first electrode layer and the base substrate, wherein a via hole is formed in a portion of the first insulating layer which is disposed in the peripheral region;

a circuit structure disposed in the peripheral region, wherein the circuit structure includes a first circuit structure disposed between the barrier structure and the display region, and the first circuit structure includes a first circuit sub-pattern and a second circuit sub-pattern, wherein the first circuit sub-pattern is disposed in a first metal layer, the second circuit sub-pattern is disposed in a second metal layer, the first metal layer and the second metal layer are disposed on two sides of the first insulating layer, the via hole in the first insulating layer includes a first via hole, and the first circuit sub-pattern and the second circuit sub-pattern are electrically connected to each other through the first via hole;

a second insulating layer disposed on a side of the second metal layer away from the base substrate; and a third insulating layer disposed on a side of the second insulating layer away from the base substrate, wherein the third insulating layer includes a body pattern disposed in the display region and the peripheral region, and the body pattern includes a third side surface disposed in the peripheral region, wherein an orthographic projection of the third side surface on the base substrate is between the barrier structure and the display region;

wherein the connecting structure is provided with a plurality of openings, wherein an orthographic projection of the opening on the base substrate covers an orthographic projection of the first via hole on the base substrate.

In some embodiments of the present disclosure, a display device is provided. The display device includes: a power supply assembly and the display panel as described in the above embodiments; wherein the power supply assembly is configured to supply power to the display panel

BRIEF DESCRIPTION OF DRAWINGS

For clearer descriptions of the technical solutions in the embodiments of the present disclosure, the accompanying drawings required for describing the embodiments are described below. The accompanying drawings in the following description show merely some embodiments of the present disclosure, and those of ordinary skill in the art may still derive other drawings from these accompanying drawings without creative effort.

DETAILED DESCRIPTION

Figure 1:
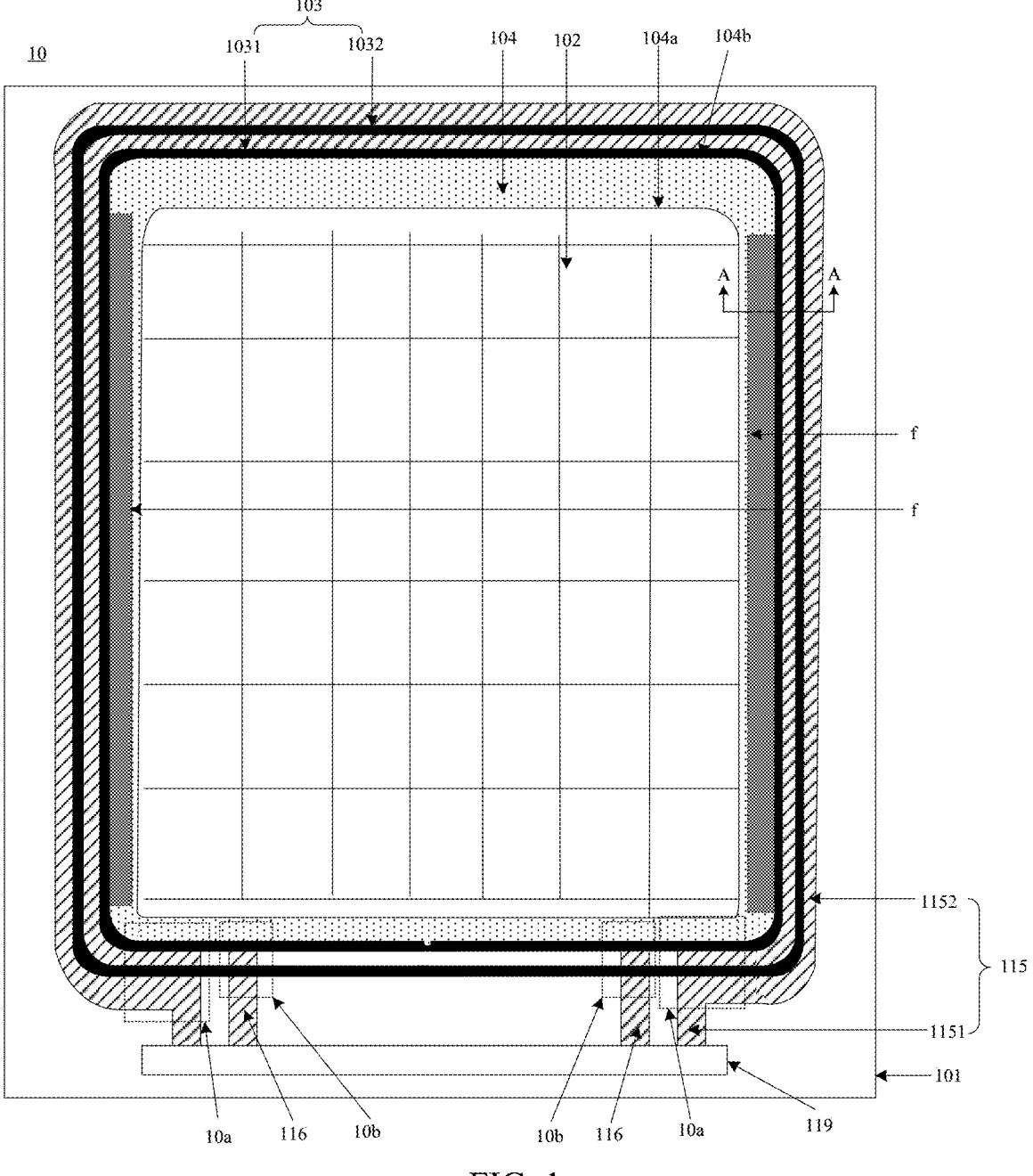
FIG. 1 is a schematic structural diagram of a display panel according to some embodiments of the present disclosure.

To make the objectives, technical solutions, and advantages of the present disclosure clearer, the embodiments of the present disclosure will be further described in detail below with reference to the accompanying drawings.

In the related art, at least one circuit structure in the drive circuit includes a first metal pattern in a first metal layer and a second metal pattern in a second metal layer in the display panel. An insulating layer is provided between the first metal layer and the second metal layer, and the first metal pattern and the second metal pattern are lapped with each other via a via hole in the insulating layer. In order to reduce the voltage drop of the display panel, the VSS trace and the cathode layer overlap are lapped with each other by means of a connecting structure in an anode layer of the display panel. Another insulating layer is provided between the connecting structure in the anode layer and the second metal pattern in the circuit structure to insulate the connecting structure from the signal line.

However, since it's easy for the other insulating layer at the position where the first metal pattern and the second metal pattern are lapped to be over-etched, the connecting structure and the circuit structure may be short circuited, and the yield of the display panel is low.

In the related art, the display panel includes a base substrate, and a circuit structure and a connecting structure which are disposed in a peripheral region of the base substrate, and a first insulating layer and a second insulating layer which are disposed on the base substrate. The first circuit pattern (the first circuit pattern is disposed in the first metal layer) and the second circuit pattern (the second circuit pattern is disposed in the second metal layer) in the circuit structure are respectively disposed on two sides of the first insulating layer and are electrically connected to each other through a via hole in the first insulating layer. The second insulating layer is disposed between the second metal layer and the connecting structure for insulating the circuit structure from the connecting structure.

Generally, the display panel further includes a third metal layer disposed in the display region of the base substrate. The third metal layer is disposed between the second insulating layer and the connecting structure. The process of preparing the third metal layer includes: forming a third metal film on the side of the second insulating layer away from the base substrate, coating the side of the third metal film away from the base substrate with photoresist, exposing the photoresist by using a mask, developing the exposed photoresist, etching the portion of the third metal film which is not protected by the photoresist with an etching solution, and removing the remaining photoresist to acquire the third metal layer.

Since the finally manufactured third metal layer is not disposed in the peripheral region, the portion of the third metal film which is disposed in the peripheral region needs to be etched with the etching solution. Since the circuit structure (the first metal pattern and the second metal pattern of the circuit structure are electrically connected to each other through the via hole in the first insulating layer) is provided in the peripheral region, when the third metal film is etched, the etching solution easily collects at the position of the via hole. As a result, the portion of the second insulating layer which is disposed at the via hole is over-etched (generally, the second insulating layer is relatively thin, and is easily etched through by the etching solution). Further, in the case that the portion of the second insulating layer which is disposed at the via hole is over-etched, the second insulating layer loses the effect of insulating circuit structure from the connecting structure, resulting a short circuit between the connecting structure and the second circuit pattern in the circuit structure due to direct contact therebetween. Therefore, the yield of the display panel is low.

Figure 2:
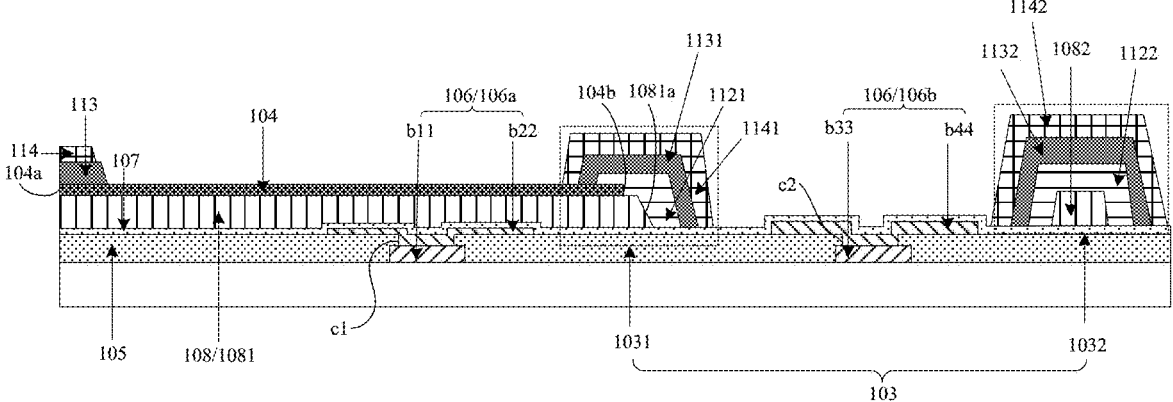
FIG. 2 is a partial sectional view of a display panel in a peripheral region according to some embodiments of the present disclosure.

FIG. 1 is a schematic structural diagram of a display panel according to some embodiments of the present disclosure. FIG. 2 is a partial sectional view of a display panel in a peripheral region according to some embodiments of the present disclosure. Referring to FIG. 1 and FIG. 2, the display panel 10 includes: a base substrate 101, a plurality of pixel units 102, a barrier structure 103, a connecting structure 104, a first insulating layer 105, a circuit structure 106, a second insulating layer 107, and a third insulating layer 108 disposed on the side of the second insulating layer 107 away from the base substrate 101. FIG. 2 is a sectional view of FIG. 1 along the AA direction.

Figure 3:
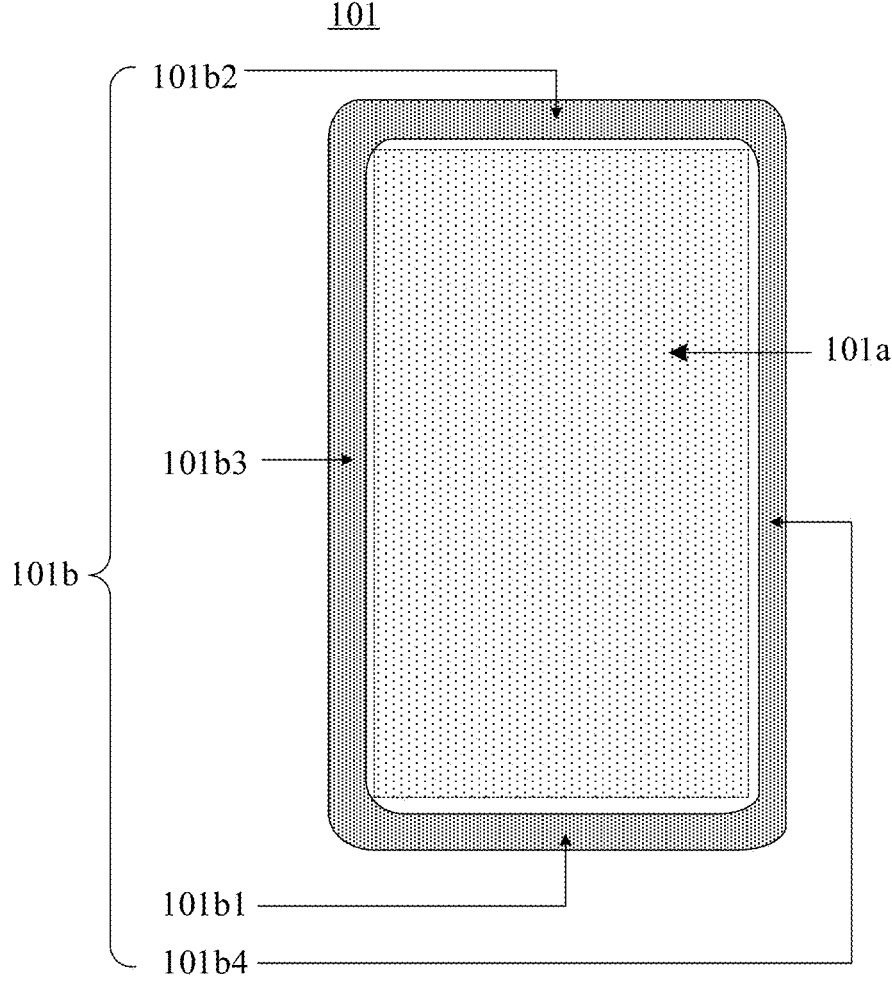
FIG. 3 is a schematic structural diagram of a base substrate according to some embodiments of the present disclosure.

FIG. 3 is a schematic structural diagram of a base substrate according to some embodiments of the present disclosure. Referring to FIG. 3, the base substrate 101 has a display region 101*a* and a peripheral region 101*b* surrounding the display region 101*a*. With reference to FIG. 1 to FIG. 3, the plurality of pixel units 102 are disposed in the display region 101*a*, and the barrier structure 103, the connecting structure 104 and the circuit structure 106 are disposed in the peripheral region 101*b*.

Figure 4:
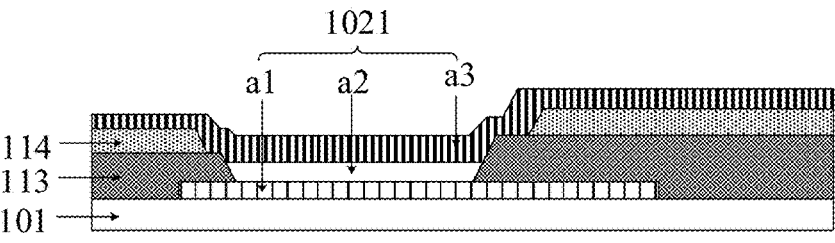
FIG. 4 is a schematic structural diagram of a light-emitting unit according to some embodiments of the present disclosure.

In the embodiments of the present disclosure, referring to FIG. 4, the pixel unit 102 includes a light-emitting unit 1021. The light-emitting unit 1021 includes a first electrode layer a1, a light-emitting layer a2 and a second electrode layer a3 which are stacked in sequence. For example, the first electrode layer a1 is an anode layer, and the second electrode layer a3 is a cathode layer.

With reference to FIG. 1 to FIG. 3, the barrier structure 103 surrounds the plurality of pixel units 102. The connecting structure 104 and the first electrode layer a1 are disposed in the same layer and are spaced apart from each other, and the connecting structure 104 is electrically connected to the second electrode layer a3. That is, the connecting structure 104 and the first electrode layer a1 are made of the same material and are manufactured by a single patterning process. The signal transmitted by the connecting structure 104 is the same as the signal transmitted by the second electrode layer a3.

Referring to FIG. 2, the circuit structure 106 is disposed in the peripheral region 101b, and the circuit structure 106 includes a first circuit structure 106a. The first circuit structure 106a includes a first circuit sub-pattern b11 and a second circuit sub-pattern b22. The first circuit sub-pattern b11 is disposed in a first metal layer, and the second circuit sub-pattern b22 is disposed in a second metal layer. The first insulating layer 105 in the display panel 10 is disposed between the first metal layer and the second metal layer. A via hole (including a first via hole c1) is formed in the portion of the first insulating layer 105 which is disposed in the peripheral region 101b, and the first circuit sub-pattern b11 and the second circuit sub-pattern b22 are electrically connected to each other through the first via hole c1. The second insulating layer 107 is disposed on the side of the second metal layer away from the base substrate 101, and is configured to insulate the second circuit sub-pattern b22 in the second metal layer from the connecting structure 104 which is disposed in the same layer as the first electrode layer a1.

In the embodiments of the present disclosure, the third insulating layer 108 includes a body pattern 1081 disposed in the display region 101a and the peripheral region 101b, and the body pattern 1081 includes a third side surface 1081a disposed in the peripheral region 101b. The orthographic projection of the third side surface 1081a on the base substrate 101 is within the orthographic projection of the barrier structure 103 on the base substrate 101. In addition, the portions of the body pattern 1081 which are disposed in the peripheral region 101b are continuous patterns on the side of the third side surface 1081a close to the display region 101a.

Since the portions of the body pattern 1081 of the third insulating layer 108 which are disposed in the peripheral region 101b are continuous patterns on the side of the third side surface 1081a close to the display region 101a, and the third side surface 1081a of the body pattern 1081 is within the orthographic projection of the barrier structure 103 on the base substrate 101, the orthographic projection of the body pattern 1081 on the base substrate 101 covers the orthographic projection of the first via hole c1 on the base substrate 101. Therefore, the body pattern 1081 can protect the position of the first via hole c1. In this way, even if the second insulating layer 107 at the first via hole c1 is over-etched, the connecting structure 104 can be prevented from being short-circuited with the second circuit sub-pattern b22 of the first circuit structure 106a, thereby ensuring the yield of the display panel 10.

In summary, the embodiments of the present disclosure provide a display panel, including a base substrate, a plurality of pixel units, a barrier structure, a connecting structure, a first insulating layer, a circuit structure, a second insulating layer, and a third insulating layer. The first insulating layer is disposed between the first circuit sub-pattern and the second circuit sub-pattern of the first circuit structure and is provided with a first via hole therein, and the first circuit sub-pattern and the second circuit sub-pattern are electrically connected to each other through the first via hole. Since the orthographic projection of the third insulating layer on the base substrate covers the orthographic projection of the first via hole on the base substrate, even if the second insulating layer at the first via hole is over-etched, the connecting structure can be prevented from being short-circuited with the second circuit sub-pattern of the first circuit structure, thereby ensuring the yield of the display panel.

In some embodiments, that the portions of the body pattern 1081 of the third insulating layer 108 which are disposed in the peripheral region 101b are continuous patterns on the side of the third side surface 1081a close to the display region 101a refers to that the portions of the body pattern 1081 which are disposed on the left and right side regions of the peripheral region 101b (e.g., the second region 101b2 and the fourth region 101b4 as described below) are continuous patterns on the side of the third side surface 1081a close to the display region 101a.

In the embodiments of the present disclosure, referring to FIG. 1, the barrier structure 103 is an annular structure surrounding the plurality of pixel units 102, and is configured to block an organic layer, disposed in the region enclosed by the barrier structure 103, in the display panel 10 from overflowing. The barrier structure 103 includes a first barrier dam 1031 and a second barrier dam 1032. The first barrier dam 1031 is closer to the plurality of pixel units 102 than the second barrier dam 1032 is, and the thickness of the first barrier dam 1031 is less than the thickness of the second barrier dam 1032.

Two barrier dams are provided, and the thickness of the second barrier dam 1032 away from the plurality of pixel units 102 is greater than the thickness of the first barrier dam 1031 close to the plurality of pixel units 102, which can further prevent the organic layer disposed in the region enclosed by the barrier structure 103 from overflowing. Certainly, in some embodiments, the barrier structure 103 also includes one barrier dam, or more than two barrier dams, which is not limited in the embodiments of the present disclosure.

Referring to FIG. 1, the orthographic projections of the first barrier dam 1031 and the second barrier dam 1032 on the base substrate 101 are both annular. That the first barrier dam 1031 is closer to the plurality of pixel units 102 than the second barrier dam 1032 is refers to that the region enclosed by the first barrier dam 1031 is in the region enclosed by the second barrier dam 1032.

In the embodiments of the present disclosure, the edge away from the display region 101a of the orthographic projection of the connecting structure 104 on the base substrate 101 is closer to the display region 101a than the edge away from the display region 101a of the orthographic projection of the barrier structure 103 on the base substrate 101 is. Here, the edge, away from the display region 101a of the orthographic projection of the barrier structure 103 on the base substrate 101 refers to the edge, away from the display region 101a of the orthographic projection of the second barrier dam 1032 on the base substrate 101.

Referring to FIG. 2, the first circuit structure 106*a* of the circuit structure 106 is disposed between the first barrier dam 1031 and the display region 101*a*. In addition, the circuit structure 106 further includes a second circuit structure 106*b* disposed between the first barrier dam 1031 and the second barrier dam 1032. The second circuit structure 106*b* includes a third circuit sub-pattern b33 and a fourth circuit sub-pattern b44. The via hole in the first insulating layer 105 includes a second via hole c2, and the third circuit sub-pattern b33 and the fourth circuit sub-pattern b44 are electrically connected to each other through the second via hole c2.

In the embodiments of the present disclosure, the first circuit structure 106*a* is a related structure in a gate driver on array (GOA) circuit in the display panel 10, and the second circuit structure 106*b* is a related structure in a signal input circuit that provides related signals for the GOA circuit in the display panel.

As an optional implementation, referring to FIG. 1 to FIG. 3, the connecting structure 104 has a first side surface 104*a* and a second side surface 104*b* opposite to each other, and the first side surface 104*a* is closer to the plurality of pixel units 102 than the second side surface 104*b* is. The orthographic projection of the second side surface 104*b* on the base substrate 101 is within the orthographic projection of the first barrier dam 1031 on the base substrate 101, and the orthographic projection of the connecting structure 104 on the base substrate 101 is not overlapped with the orthographic projection of the second barrier dam 1032 on the base substrate 101. That is, the connecting structure 104 is disposed in a region between the first barrier dam 1031 and the display region 101*a*, but is not in a region between the first barrier dam 1031 and the second barrier dam 1032.

In this implementation, since the orthographic projection of the second side surface 104*b* (boundary) of the connecting structure 104 on the base substrate 101 is within the orthographic projection of the first barrier dam 1031 on the base substrate 101, there is a short circuit risk between connecting structure 104 and the second circuit sub-pattern b22 of the first circuit structure 106*a*, and there is no short circuit risk between the connecting structure 104 and the fourth circuit sub-pattern b44 of the second circuit structure 106*b*.

In the embodiments of the present disclosure, the orthographic projection of the body pattern 1081 of the third insulating layer 108 on the base substrate 101 covers the orthographic projection of the second circuit sub-pattern b22 on the base substrate 101 (that is, the third insulating layer 108 is extended to the first barrier dam 1031). Therefore, in addition to the second insulating layer 107, the third insulating layer 108 is also present between the connecting structure 104 and the second circuit sub-pattern b22 of the first circuit structure 106*a*. The third insulating layer 108 functions to insulate the connecting structure 104 from the second circuit sub-pattern b22. In this way, even if the second insulating layer 107 at the first via hole c1 is over-etched (e.g., the second circuit sub-pattern b22 of the first circuit structure 106*a* is exposed due to the over-etching of the second insulating layer 107), since the third insulating layer 108 can cover the over-etched region of the second insulating layer 107, the connecting structure 104 and the second circuit sub-pattern b22 can be prevented from being short-circuited, thereby ensuring the yield of the display panel 10.

Figure 5:
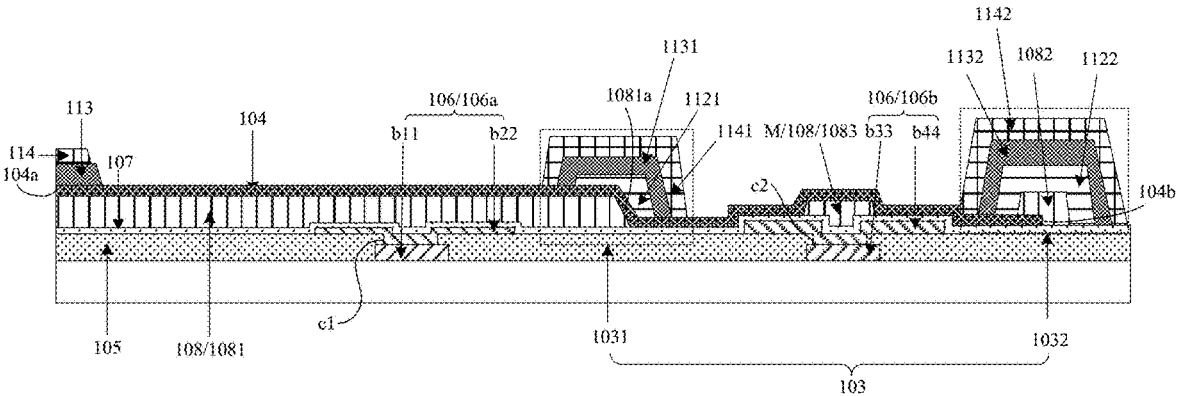
FIG. 5 is a partial sectional view of another display panel in a peripheral region according to some embodiments of the present disclosure.

As another optional implementation, referring to FIG. 5, the connecting structure 104 has a first side surface 104*a* and a second side surface 104*b* opposite to each other, and the first side surface 104*a* is closer to the plurality of pixel units 102 than the second side surface 104*b* is. The orthographic projection of the second side surface 104*b* on the base substrate 101 is within the orthographic projection of the second barrier dam 1032 on the base substrate 101, and the orthographic projection of the connecting structure 104 on the base substrate 101 is overlapped with the orthographic projection of the first barrier dam 1031 on the base substrate 101. That is, the connecting structure 104 is disposed in a region between the first barrier dam 1031 and the display region 101*a*, and is also disposed in a region between the first barrier dam 1031 and the second barrier dam 1032.

Furthermore, referring to FIG. 5, the orthographic projection of the third side surface 1081*a* of the body pattern 1081 of the third insulating layer 108 on the base substrate 101 is within the orthographic projection of the first barrier dam 1031 on the base substrate 101. Therefore, the body pattern 1081 of the third insulating layer can protect the second circuit sub-pattern b22 of the first circuit structure 106*a*, but cannot protect the fourth circuit sub-pattern b44 of the second circuit structure 106*b*.

Therefore, in this implementation, since the orthographic projection of the second side surface 104*b* (boundary) of the connecting structure 104 on the base substrate 101 is within the orthographic projection of the second barrier dam 1032 on the base substrate 101, there is a short circuit risk between the connecting structure 104 and the fourth circuit sub-pattern b44 of the second circuit structure 106*b*. In order to prevent the connecting structure 104 and the fourth circuit sub-pattern b44 of the second circuit structure 106*b* from being short-circuited, the display panel 10 further includes a protection layer M disposed on the base substrate 101. The protection layer M includes a plurality of protection patterns. The orthographic projection of the protection pattern on the base substrate 101 covers the orthographic projection of the second via hole c2 on the base substrate 101.

The protection layer M is disposed between the first metal layer and the base substrate 101, or the protection layer M is disposed on the side of the second insulating layer 107 away from the base substrate 101. By providing the protection layer M, either the second insulating layer 107 at the second via hole c2 can be prevented from being over-etched or the connecting structure 104 and the fourth circuit pattern b44 of the second circuit structure 106*b* can be prevented from being short-circuited even if the second insulating layer 107 at the second via hole c2 is over-etched, thereby ensuring the yield of the display panel 10.

In the embodiments of the present disclosure, the protection layer M has the following optional implementations.

First solution, referring to FIG. 5, the plurality of protection patterns of the protection layer M are disposed in the third insulating layer 108. That is, the plurality of protection patterns of the protection layer M and the body pattern 1081 of the third insulating layer 108 are made of the same material and are manufactured by a single patterning process. For example, in FIG. 5, the fourth insulating pattern 1083 included in the third insulating layer 108 is the protection pattern.

That is, the fourth insulating pattern 1083 is provided on the second insulating layer 107 at the second via hole c2, and the fourth insulating pattern 1083 functions to insulate the connecting structure 104 from the fourth circuit sub-pattern b44. In this way, even if the second insulating layer 107 at the second via hole c2 is over-etched (e.g., the fourth circuit sub-pattern b44 of the second circuit structure 106*b* is exposed due to the over-etching of the second insulating layer 107), since the fourth insulating pattern 1083 of the third insulating layer 108 covers the over-etched region of the second insulating layer 107, the connecting structure 104 and the fourth circuit sub-pattern b44 can be prevented from being short-circuited, thereby ensuring the yield of the display panel 10.

Figure 6:
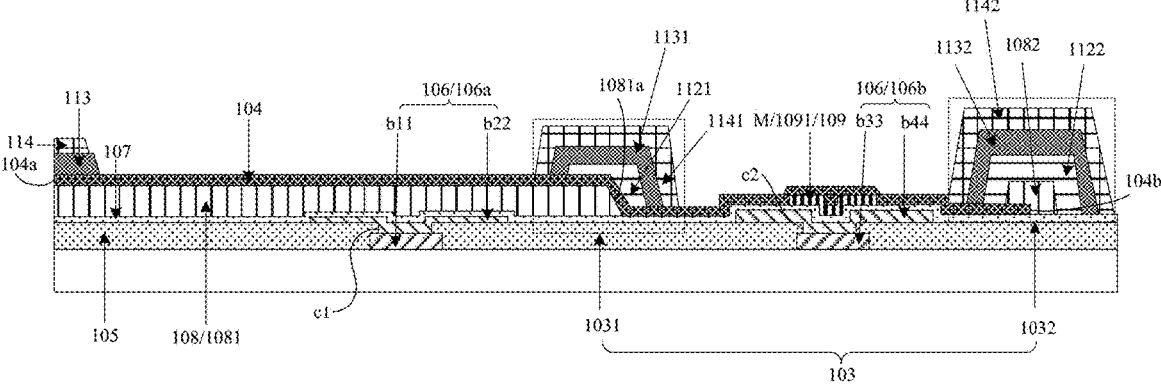
FIG. 6 is a partial sectional view of still another display panel in a peripheral region according to some embodiments of the present disclosure.

Second solution, referring to FIG. 6, the protection layer M is a third metal layer 109 disposed on the side of the second insulating layer 107 away from the base substrate 101. The plurality of metal patterns 1091 of the third metal layer 109 are the protection patterns. The orthographic projection of the metal pattern 1091 on the base substrate 101 covers the orthographic projection of the second via hole c2 on the base substrate 101.

The third metal layer 109 is a second source-drain electrode layer of the display panel. Generally, the third metal layer 109 is not disposed in the peripheral region 101b. Therefore, when a third metal film for forming the third metal layer 109 is etched by using an etching solution, the portion of the third metal film which is disposed in the peripheral region 101b needs to be etched away. However, in the process of etching the third metal film, the etching solution easily collects at the via hole (the first via hole c1 or the second via hole c2), which causes the portion of the second insulating layer 107 which is disposed at the via hole to be over-etched.

In this solution of the embodiments of the present disclosure, the body pattern 1081 of the third insulating layer 108 covers the first via hole c1, thereby protecting the second circuit sub-pattern b22 of the first circuit structure 106a, and preventing the connecting structure 104 and the second circuit sub-pattern b22 of the first circuit structure 106a from being short-circuited. In addition, the metal pattern 1091 of the third metal layer 109 which is disposed in the second via hole c2 is retained. Therefore, when the third metal film is etched, the third metal film disposed in the second via hole c2 does not need to be etched away, and thus the etching solution does not collect at the second via hole c2, thereby preventing the second insulating layer 107 at the second via hole c2 from being over-etched. Furthermore, the connecting structure 104 and the fourth circuit sub-pattern b44 of the second circuit structure 106b can be prevented from being short-circuited. Therefore, there is no short circuit risk at the first via hole c1 and the second via hole c2, thereby ensuring the yield of the display panel.

In the embodiments of the present disclosure, since the metal pattern 1091 of the third metal layer 109 has a conductive capability, a signal line is provided to be connected to the metal pattern 1091, so as to provide a fixed voltage for the metal pattern 1091. Certainly, when the signal line is provided, the display panel will have more traces, and thus the layout design is difficult. Therefore, the metal pattern 1091 is directly designed as a floating pattern, without providing a fixed voltage for the metal pattern 1091.

Figure 7:
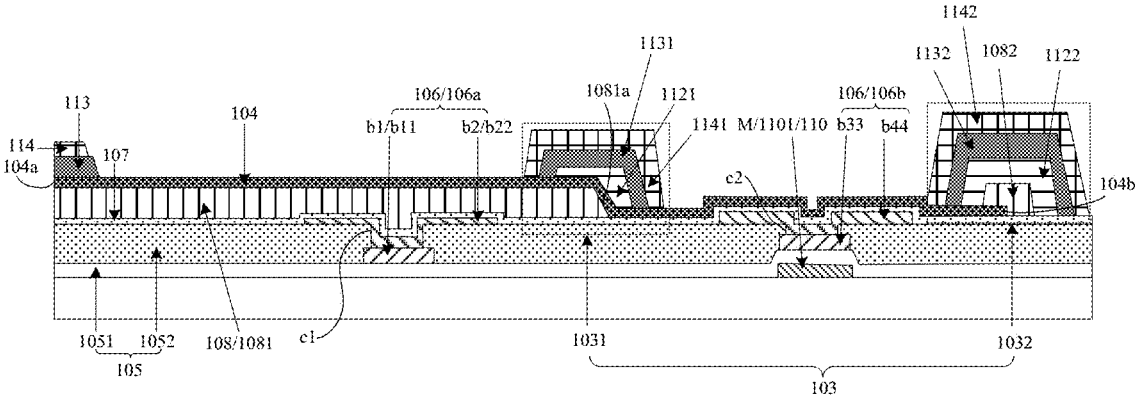
FIG. 7 is a partial sectional view of yet another display panel in a peripheral region according to some embodiments of the present disclosure.

Third solution, referring to FIG. 7, the protection layer M is an active layer 110 disposed between the base substrate 101 and the first metal layer. The plurality of active patterns 1101 of the active layer 110 are the protection patterns. The orthographic projection of the active pattern 1101 on the base substrate 101 covers the orthographic projection of the second via hole c2 on the base substrate 101.

In this solution of the embodiments of the present disclosure, the body pattern 1081 of the third insulating layer 108 covers the first via hole c1, thereby protecting the second circuit sub-pattern b22 of the first circuit structure 106a, and preventing the connecting structure 104 and the second circuit sub-pattern b22 of the first circuit structure 106a from being short-circuited. Since the active layer 110 is disposed on the side of the first metal layer close to the base substrate 101, by providing the active pattern at the second via hole c2, the distance between the third circuit sub-pattern b33 and the fourth circuit sub-pattern b44 which are disposed on the side of the active pattern 1101 away from the base substrate 101 is relatively close, and thus the first insulating layer 105 is relatively thin at the positions of the third circuit sub-pattern b33 and the fourth circuit sub-pattern b44. Therefore, the depth of the second via hole c2 formed in the first insulating layer 105 is reduced. Since the second via hole c2 in the first insulating layer 105 has a small depth, the degree of collection of the etching solution can be reduced, and the probability of over-etching the second insulating layer 107 at the second via hole c2 is reduced, thereby preventing the connecting structure 104 and the fourth circuit sub-structure b44 from being short-circuited. That is, there is no short circuit risk at the first via hole c1 and the second via hole c2, thereby ensuring the yield of the display panel.

It should be noted that in the third solution, the first insulating layer 105 includes a first sub-insulating layer 1051 and a second sub-insulating layer 1052. The first sub-insulating layer 1051 is disposed between the active layer and the first metal layer, and the second sub-insulating layer 1052 is disposed between the first metal layer and the second metal layer.

Figure 8:
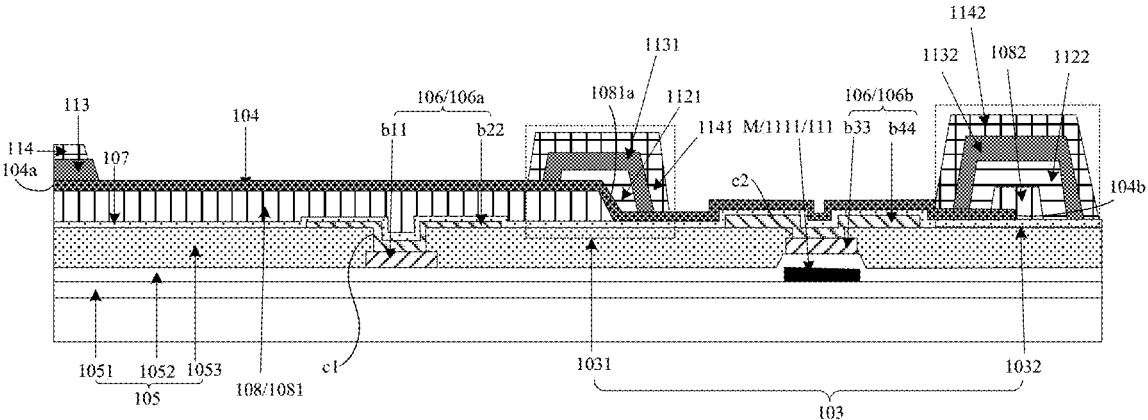
FIG. 8 is a partial sectional view of yet another display panel in a peripheral region according to some embodiments of the present disclosure.

Fourth solution, referring to FIG. 8, the protection layer M is a light-shielding layer 111 disposed between the base substrate 101 and the first metal layer. The plurality of light-shielding patterns 1111 of the light-shielding layer 111 are the protection patterns. The orthographic projection of the light-shielding pattern 1111 on the base substrate 101 covers the orthographic projection of the second via hole c2 on the base substrate 101.

In this solution of the embodiments of the present disclosure, the body pattern 1081 of the third insulating layer 108 covers the first via hole c1, thereby protecting the second circuit sub-pattern b22 of the first circuit structure 106a, and preventing the connecting structure 104 and the second circuit sub-pattern b22 of the first circuit structure 106a from being short-circuited. Since the light-shielding layer 111 is disposed on the side of the first metal layer close to the base substrate 101, by providing the light-shielding pattern 1111 at the second via hole c2, the distance between the third circuit sub-pattern b33 and the fourth circuit sub-pattern b44 which are disposed on the side of the light-shielding pattern 1111 away from the base substrate 101 is relatively close, and thus the first insulating layer 105 is relatively thin at the positions of the third circuit sub-pattern b33 and the fourth circuit sub-pattern b44. Therefore, the depth of the second via hole c2 formed in the first insulating layer 105 is reduced. Since the second via hole c2 in the first insulating layer 105 has a small depth, the degree of collection of the etching solution can be reduced, and the probability of over-etching the second insulating layer 107 at the second via hole c2 can be reduced, thereby preventing the connecting structure 104 and the fourth circuit sub-structure b44 from being short-circuited. That is, there is no short circuit risk at the first via hole c1 and the second via hole c2, thereby ensuring the yield of the display panel.

It should be noted that in the fourth solution, the first insulating layer 105 includes a first sub-insulating layer 1051, a second sub-insulating layer 1052 and a third sub-insulating layer 1053. The first sub-insulating layer 1051 is disposed between the base substrate 101 and the light-shielding layer 111, the second sub-insulating layer 1052 is disposed between the light-shielding layer 111 and the first metal layer, and the third sub-insulating layer 1053 is disposed between the first metal layer and the second metal layer.

In the foregoing solutions, a difference value obtained by subtracting the area of the orthographic projection of the second via hole c2 on the base substrate 101 from the area of the orthographic projection of the protection pattern on the base substrate 101 ranges from 1 $\mu m^2$ (square microns) to 50 $\mu m^2$. By making the protection pattern slightly bigger than the second via hole c2, the connecting structure 104 and the fourth circuit sub-pattern b44 can be prevented from being short-circuited.

In addition, in order to reduce the difficulty of preparing the mask used for preparing the protection layer M, the setting density of the protection patterns needs to be reduced. For example, a plurality of second via holes c2 correspond to one protection pattern (that is, the orthographic projection of each protection pattern on the base substrate 101 covers the orthographic projections of a plurality of second via holes c2 on the base substrate 101, and the number of the protection patterns is less than the number of the second via holes c2). In some embodiments, the protection pattern is adjusted to be strip-shaped or in other shapes based on the design of the second via hole c2, and the shape of the protection pattern is not limited in the embodiments of the present disclosure.

In some embodiments, the plurality of second via holes c2 include a plurality of target second via holes, and the orthographic projections of the plurality of target second via holes on the base substrate 101 are covered by the orthographic projection of the same protection pattern on the base substrate 101. If the spacing between any target second via hole and another target second via hole of the plurality of target second via holes is less than 4 $\mu m$ (micrometer), it is considered that the spacing between the two target second via holes is small, and is covered by one protection pattern.

Figure 9:
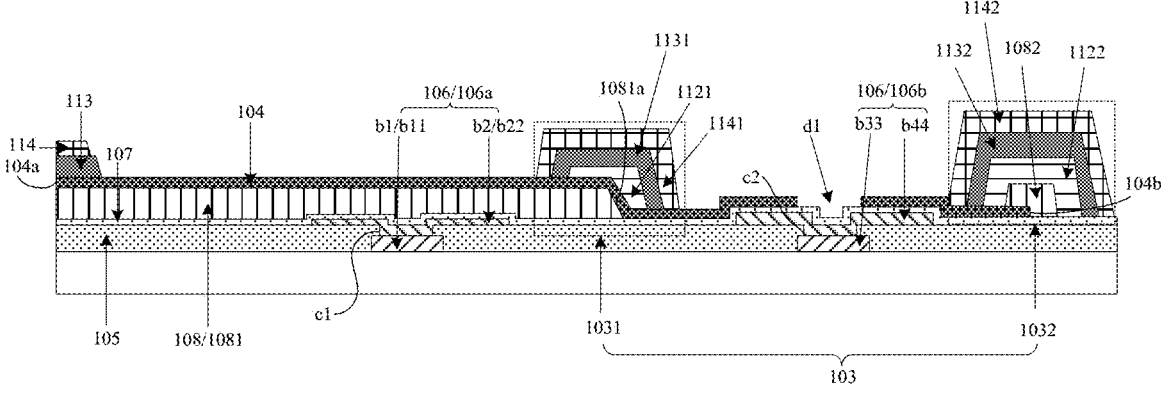
FIG. 9 is a partial sectional view of yet another display panel in a peripheral region according to some embodiments of the present disclosure.

In addition to the above implementations of the protection layer M, in order to prevent the connecting structure 104 and the fourth circuit sub-pattern b44 of the second circuit structure 106b from being short-circuited, referring to FIG. 9, the connecting structure 104 is provided with a plurality of openings d1. The orthographic projection of the opening d1 on the base substrate 101 covers the orthographic projection of the second via hole c2 on the base substrate 101.

Since the connecting structure 104 is provided with an opening d1 at the second via hole c2, even if the second insulating layer 107 at the second via hole c2 is over-etched (e.g., the fourth circuit sub-pattern b44 of the second circuit structure 106b is exposed due to the over-etching of the second insulating layer 107), the connecting structure 104 and the fourth circuit sub-pattern b44 can be prevented from being short-circuited, thereby ensuring the yield of the display panel 10.

In some embodiments, a difference value obtained by subtracting the area of the orthographic projection of the second via hole c2 on the base substrate 101 from the area of the orthographic projection of the opening d1 on the base substrate 101 ranges from 1 $\mu m^2$ to 50 $\mu m^2$. By making the opening d1 slightly bigger than the second via hole c2, it is further ensured that the connecting structure 104 and the fourth circuit sub-pattern b44 will not be short-circuited.

In addition, the hole density of the second via holes c2 in the display panel 10 is related to the specific design of the signal input circuit providing signals for the GOA circuit in the display panel 10. If the hole density of the second via holes c2 is low, even if each second via hole c2 corresponds to one opening (that is, the orthographic projection of each opening on the base substrate 101 covers the orthographic projection of one second via hole c2 on the base substrate 101, and the number of the openings is equal to the number of the second via holes c2), the density of the openings is not too high. In this case, it is not too difficult to prepare the mask used for preparing the connecting structure 104. However, if the hole density of the second via holes c2 is high, when each second via hole c2 corresponds to one opening, the density of the openings is too high, and it is difficult to prepare the mask used for preparing the connecting structure 104. In this case, in order to reduce the density of the openings, a plurality of second via holes c2 correspond to one opening d1 (that is, the orthographic projection of each opening d1 on the base substrate 101 covers the orthographic projections of a plurality of second via holes c2 on the base substrate 101, and the number of the openings is less than the number of the second via holes c2). In some embodiments, the opening d1 is adjusted to be strip-shaped or in other shapes based on the design of the second via hole c2, and the shape of the opening d1 is not limited in the embodiments of the present disclosure.

In some embodiments, the plurality of second via holes c2 include a plurality of target second via holes, and the orthographic projections of the plurality of target second via holes on the base substrate 101 are covered by the orthographic projection of the same opening on the base substrate 101. If the spacing between any target second via hole and another target second via hole of the plurality of target second via holes is less than 4 $\mu m$ (micrometer), it is considered that the spacing between the two target second via holes is small, and is covered by one opening d1.

In the embodiments of the present disclosure, referring to FIG. 2 and FIG. 5 to FIG. 9, the third insulating layer 108 in the display panel 10 further includes a first insulating pattern 1082. In addition, the display panel 10 further includes a fourth insulating layer 112 disposed on the side of the third insulating layer 108 away from the base substrate 101. The fourth insulating layer 112 includes a second insulating pattern 1121 and a third insulating pattern 1122.

The first barrier dam 1031 at least includes the second insulating pattern 1121, and the second barrier dam 1032 at least includes the first insulating pattern 1082 and the third insulating pattern 1122 which are stacked along the direction going away from the base substrate 101. That is, compared with the first barrier dam 1031, the second barrier dam 1032 is further provided with a layer of patterns in the third insulating layer 108. Therefore, the thickness of the second barrier dam 1032 is greater than the thickness of the first barrier dam 1031, thereby preventing the organic layer from overflowing.

In addition, the display panel 10 further includes a fifth insulating layer 113 and a sixth insulating layer 114 that are disposed on the side of the fourth insulating layer 112 away from the base substrate 101. The fifth insulating layer 113 includes a fifth insulating pattern 1131 and a sixth insulating pattern 1132, and the sixth insulating layer 114 includes a seventh insulating pattern 1141 and an eighth insulating pattern 1142. The first barrier dam 1031 further includes the fifth insulating pattern 1131 and the seventh insulating pattern 1141, and the second barrier dam 1032 further includes the sixth insulating pattern 1132 and the eighth insulating pattern 1142.

In the embodiments of the present disclosure, the plurality of patterns in each insulating layer are made of the same material and are manufactured by a single patterning process. For example, the second insulating pattern 1121 and the third insulating pattern 1122 in the fourth insulating layer 112 are made of the same material and are manufactured by a single patterning process. The fifth insulating pattern 1131 and the sixth insulating pattern 1132 in the fifth insulating layer 113 are made of the same material and are manufactured by a single patterning process. The seventh insulating pattern 1141 and the eighth insulating pattern 1142 in the sixth insulating layer 114 are made of the same material and are manufactured by a single patterning process.

The third insulating layer 108 is a first planarization layer (PLN), the fourth insulating layer 112 is a second planarization layer, the fifth insulating layer 113 is a pixel definition layer (PDL), and the sixth insulating layer 114 is a photo spacer (PS) layer.

In some embodiments, the materials of the first planarization layer 108, the second planarization layer 112, the pixel definition layer 113, and the photo spacer 114 include organic materials such as resin, which is not limited in the embodiments of the present disclosure.

In the embodiments of the present disclosure, referring to FIG. 1, the display panel 10 further includes at least one first power line 115. The at least one first power line 115 is disposed in the peripheral region 101b. The at least one first power line 115 includes a first portion 1151 and a second portion 1152. The first portion 1151 is disposed on the side of the barrier structure 103 away from the plurality of pixel units 102, and is configured to receive a first power signal. The second portion 1152 surrounds the plurality of pixel units 102, and is electrically connected to the first portion 1151 and the connecting structure 104. In this way, the first power signal is transmitted to the second electrode layer a3 through the first power line 115 and the connecting structure 104.

The first power signals provided by the second portion 1152 of the first power line 115 for the second electrode layers a3 of the plurality of pixel units 102 are negative power signals. Therefore, the first power line 115 is also referred to as a VSS power line or a VSS trace. The second electrode layer a3 is a cathode layer. The material of the first power line 115 includes a metal material for transmitting the first power signal.

In the embodiments of the present disclosure, referring to FIG. 3, the peripheral region 101b includes a first region 101b1 and a second region 101b2 arranged opposite and parallel to each other, and a third region 101b3 and a fourth region 101b4 arranged opposite and parallel to each other. The extending direction of the first region 101b1 is perpendicular to the extending direction of the third region 101b3.

In some embodiments, the first region 101b1 is a region on the lower side of the display region 101a, the second region 101b2 is a region on the upper side of the display region 101a, the third region 101b3 is a region on the left side of the display region 101a, and the fourth region 101b4 is a region on the right side of the display region 101a.

Referring to FIG. 1, the first portion 1151 of the first power line 115 is disposed in the first region 101b1, and the second portion 1152 of the first power line 115 is disposed in the second region 101b2, the third region 101b3 and the fourth region 101b4. That is, the second portion 1152 of the first power line 115 surrounds three edges of the display region 101a. Certainly, in some embodiments, the second portion 1152 also surrounds two edges or four edges of the display region 101a, which is not limited in the embodiments of the present disclosure.

In the embodiments of the present disclosure, the portion of the barrier structure 103 through which the power line passes is referred to as an incoming port, for example, the portion through which the first power line 115 passes is referred to as a first incoming port 10a. Referring to FIG. 1, the first power line 115 includes two first portions 1151, the two first portions 1151 respectively pass through the barrier structure 103, and the barrier structure 103 has two first incoming ports 10a through which the two first portions 1151 pass.

In addition, the two first portions 1151 are symmetrically disposed about an axis of the base substrate 101. For example, the two first portions 1151 are disposed on two sides of the base substrate 101. The axis of the base substrate 101 is parallel to the column direction of the plurality of pixel units 102.

In some embodiments, that the two first portions 1151 are disposed on two sides of the base substrate 101 refers to that for one first portion 1151 disposed on the same side of the axis as the third region 101b3, the distance between the first portion 1151 and the third region 101b3 is less than the distance between the first portion 1151 and the axis; and for the other first portion 1151 disposed on the same side of the axis as the fourth region 101b4, the distance between the first portion 1151 and the fourth region 101b4 is less than the distance between the first portion 1151 and the axis.

As shown in FIG. 1, the first power line 115 further includes one second portion 1152. One end of the second portion 1152 is connected to one first portion 1151, and the other end of the second portion 1152 is connected to the other first portion 1151. In some embodiments, the two first portions 1151 and the second portion 1152 are an integral structure, and the second portion 1152 of the first power line 115 is a non-closed structure.

Referring to FIG. 1, the display panel 10 further includes at least one second power line 116 disposed in the peripheral region 101b. One end of the at least one second power line 116 is disposed on the side of the barrier structure 103 away from the plurality of pixel units 102 and is configured to receive a second power signal, and the other end is disposed on the side of the barrier structure 103 close to the plurality of pixel units 102 and is electrically connected to the plurality of pixel units 102, such that the second power line 116 can provide the second power signals for the plurality of pixel units 102. In some embodiments, each second power line 116 is disposed in the first region 101b1 of the peripheral region 101b.

In some embodiments, the other end of the at least one second power line 116 is electrically connected to the thin film transistors in the plurality of pixel units 102, for example, electrically connected to the sources or the drains of the thin film transistors in the pixel units 102. The second power signals provided by the second power line 116 for the thin film transistors in the pixel units 102 are positive power signals. Therefore, the second power line 116 is also referred to as a VDD power line or a VDD trace.

Referring to FIG. 1, one end of each second power line 116 is outside the region enclosed by the barrier structure 103, and the other end is in the region enclosed by the barrier structure 103. That is, each second power line 116 passes through the barrier structure 103 into the region enclosed by the barrier structure 103. The portion of the barrier structure 103 through which the second power line 116 passes is referred to as a second incoming port 10b.

Optionally, referring to FIG. 1, the display panel 10 includes two second power lines 116, and the two second power lines 116 are symmetrically disposed about the axis of the base substrate 101. Therefore, compared to the case where the second power signals are transmitted by only one second power line 116, when the second power signals are transmitted by two second power lines 116, the reliability of the second power signals received by the pixel units 102 can be improved.

Figure 10:
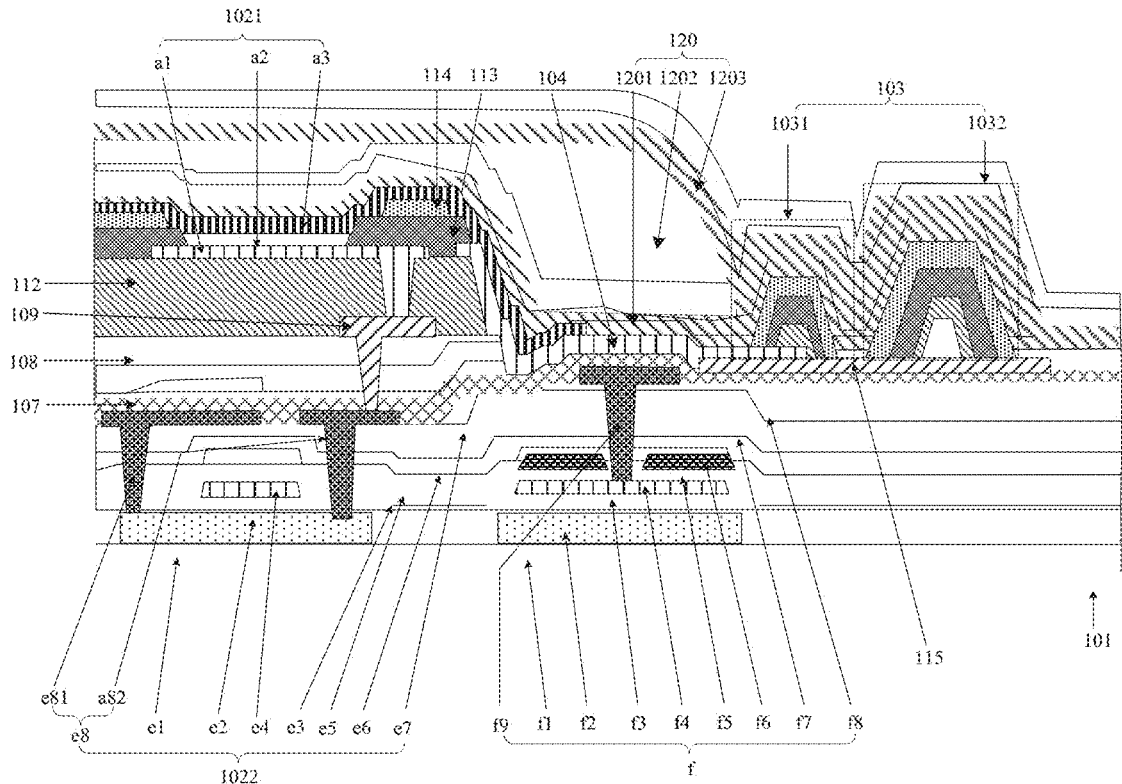
FIG. 10 is a partial sectional view of a display panel according to some embodiments of the present disclosure.

FIG. 10 is a schematic structural diagram of still another display panel according to some embodiments of the present disclosure. As can be seen from FIG. 10, each pixel unit 102 in the display panel 10 includes a thin film transistor (TFT) 1022 and a light-emitting unit 1021 stacked in sequence along the direction going away from the base substrate 101. FIG. 10 shows one pixel unit 102.

Referring to FIG. 10, the thin film transistor 1022 includes a first buffer layer e1, a third active pattern e2, a first gate insulating layer (GI) e3, a first gate pattern e4, a second gate insulating layer e5, a second buffer layer e6, an interlayer dielectric (ILD) layer e7, and a source-drain electrode e8 which are sequentially stacked along the direction going away from the base substrate 101. The source-drain electrode includes a source(S) and a drain (D) spaced apart from each other, and the source and the drain are both connected to the third active pattern e2.

Referring to FIG. 10, the light-emitting unit 1021 includes an anode in the anode layer a1, a light-emitting pattern in the light-emitting layer a2, and a cathode layer a3 which are sequentially stacked along the direction going away from the base substrate 101.

In addition, the first circuit structure 106a in the embodiments of the present disclosure is a related structure in the GOA circuit. As can be seen from FIG. 10, the GOA circuit f in the display panel includes a first buffer layer f1, a fourth active pattern f2, a first gate insulating layer f3, a second gate pattern f4, a second gate insulating layer f5, a third gate pattern f6, a second buffer layer f7, an interlayer dielectric layer f8, and a first source-drain electrode layer f) which are sequentially stacked along the direction going away from the base substrate 101. The first source-drain electrode layer includes a second connection pattern, and the second connection pattern is connected to the second gate pattern f4 to implement signal transmission.

In addition, the display panel 10 further includes a passivation layer (the second insulating layer 107), a first planarization layer (the third insulating layer 108), a second source-drain electrode layer (the third metal layer 109), and a second planarization layer (the fourth insulating layer 112).

In the embodiments of the present disclosure, each of the first buffer layer, the first gate insulating layer, the second gate insulating layer, the second buffer layer, the interlayer dielectric layer, the passivation layer, the first planarization layer and the second planarization layer is a common film layer of the thin film transistors 1022 of the plurality of pixel units 102 and the GOA circuit f in the display panel 10.

Referring to FIG. 10, the pixel definition layer 113 in the display panel 10 is disposed on the side of the anode layer away from the base substrate 101, and the photo spacer layer 114 is disposed on the side of the pixel definition layer 113 away from the base substrate 101. The pixel definition layer 113 is provided with a plurality of openings, and each opening exposes one anode in the anode layer. As such, the light-emitting pattern subsequently formed in the opening is in contact with the anode, and thus the pixel units 102 emit light.

In the embodiments of the present disclosure, the GOA circuit f includes a plurality of shift register units. Each shift register unit is configured to drive one row or more rows of pixel units 102. The embodiments of the present disclosure are illustrated by taking an example in which each shift register unit is configured to drive one row of pixel units 102, but the embodiments of the present disclosure are not limited thereto.

Each shift register unit f0 is connected to one row of pixel units 102 by at least one connection trace 117, for example, connected to the light emission control sub-circuits of one row of pixel units 102, to provide light emission control signals for one row of pixel units 102. The GOA circuit is referred to as an EM GOA circuit (a light emission control gate scanning drive circuit).

Figure 11:
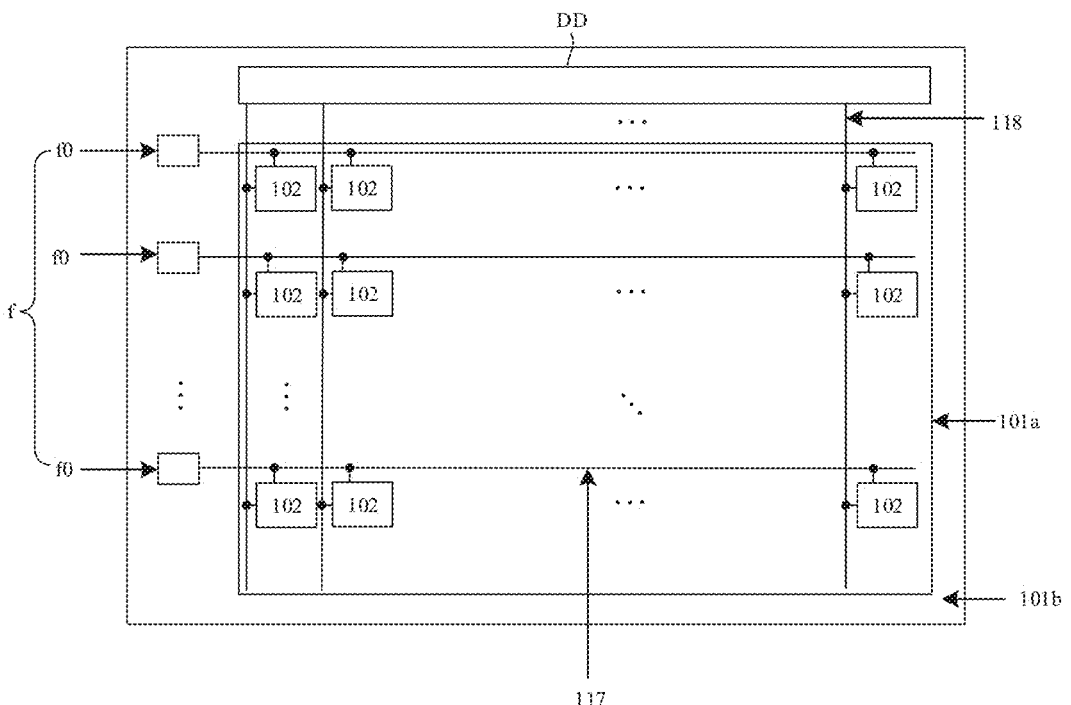
FIG. 11 is a schematic structural diagram of another display panel according to some embodiments of the present disclosure.

As shown in FIG. 11, the display panel 10 further includes a plurality of data lines 118 and a data drive circuit DD. The plurality of data lines 118 extend longitudinally through the display region 101a, and the data drive circuit DD is disposed on a side of the extending direction of the data line 118 to drive the pixel circuits 1022 in the pixel units 102 to provide data signals for the pixel units 102 arranged in an array. Thus, the display panel 10 displays. For example, each pixel unit 102 includes a pixel circuit having a circuit structure 106 such as 7T1C, 7T2C, 8T2C or 4T1C in the art, and the pixel circuit is configured to drive the light-emitting unit 1021 to emit light under the control of the data signal transmitted by the data line 118. The light-emitting unit 1021 is an organic light-emitting diode (OLED) or a quantum dot light-emitting diode (QLED), which is not limited in the embodiments of the present disclosure.

Figure 12:
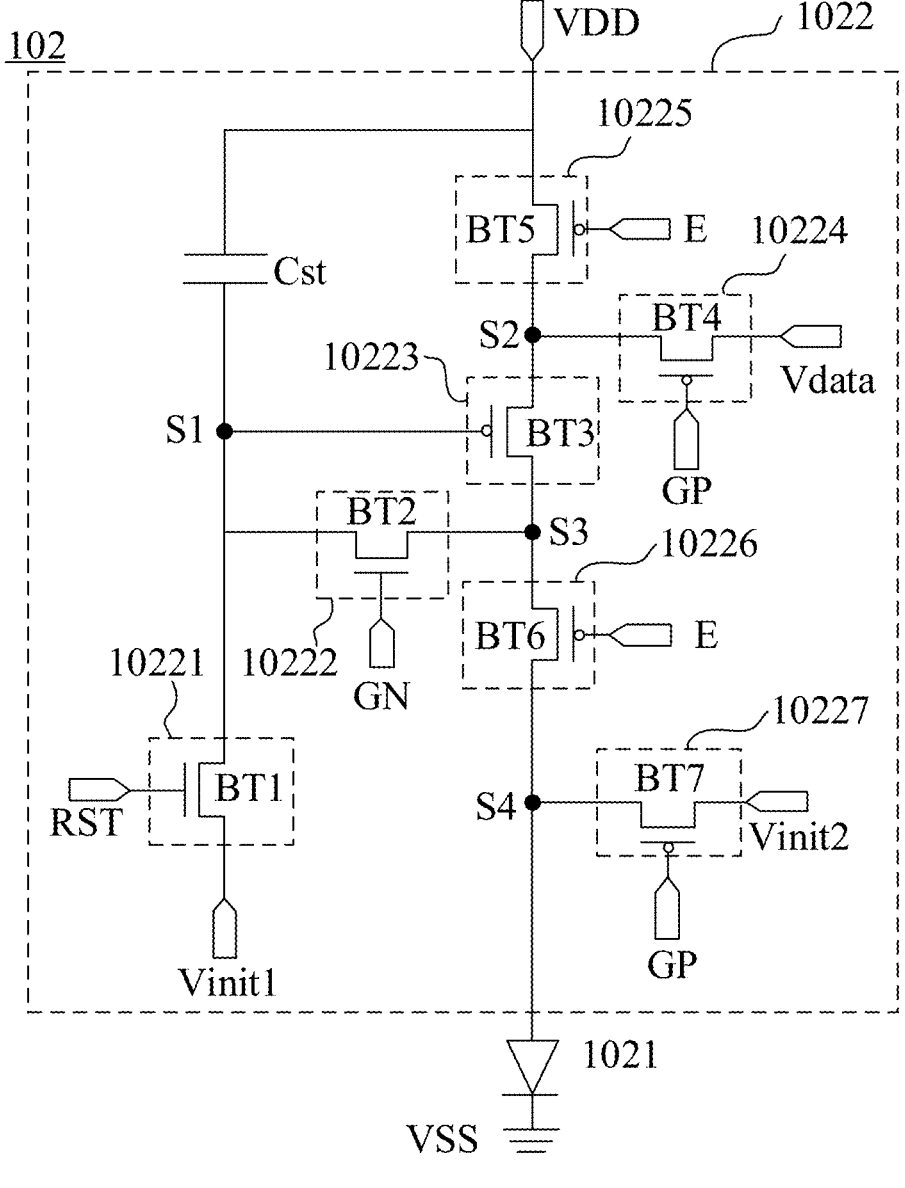
FIG. 12 is an equivalent circuit diagram of a pixel circuit according to some embodiments of the present disclosure.

FIG. 12 is an equivalent circuit diagram of a pixel circuit according to some embodiments of the present disclosure. As shown in FIG. 12, the pixel circuit 1022 in each pixel unit 102 includes a drive sub-circuit 10223, a data writing sub-circuit 10224, a threshold compensation sub-circuit 10222, a reset sub-circuit, a light emission control sub-circuit, and a storage capacitor Cst.

The first reset sub-circuit 10221 includes a first reset transistor BT1, the threshold compensation sub-circuit 10222 includes a threshold compensation transistor BT2, the drive sub-circuit 10223 includes a drive transistor BT3, the data writing sub-circuit 10224 includes a data writing transistor BT4, the first light emission control sub-circuit 10225 includes a first light emission control transistor BT5, the second light emission control sub-circuit 10226 includes a second light emission control transistor BT6, and the second reset sub-circuit 10227 includes a second reset transistor BT7. For example, the first reset transistor BT1 and the threshold compensation transistor BT2 are N-type transistors, and the data writing transistor BT4 and the second reset transistor BT7 are P-type transistors. The connection relationship and the working principle of the pixel unit 102 in the embodiments of the present disclosure are merely examples, and the pixel unit 102 may also adopt other structures as required, which is not limited in the embodiments of the present disclosure.

As shown in FIG. 12, the drive sub-circuit 10223 includes a control terminal, a first terminal and a second terminal, and is configured to control the drive current flowing through the light-emitting unit 1021. For example, the control terminal of the drive sub-circuit 10223 is connected to a first node S1, the first terminal of the drive sub-circuit 10223 is connected to a second node S2, and the second terminal of the drive sub-circuit 10223 is connected to a third node S3.

As shown in FIG. 12, the data writing sub-circuit 10224 is connected to the first terminal of the drive sub-circuit 10223, the data line 118 (Vdata) and a first gate scanning signal line GP, and is configured to write the data signal provided by the data line 118 (Vdata) to the first terminal of the drive sub-circuit 10223 in response to a data writing control signal provided by the first gate scanning signal line GP.

The threshold compensation sub-circuit 10222 is connected to the control terminal and the second terminal of the drive sub-circuit 10223, the second power line 116 (VDD trace) and a second gate scanning signal line GN, and is configured to compensate the drive sub-circuit in response to a threshold compensation control signal provided by the second gate scanning signal line GN and the data signal written into the drive sub-circuit 10223.

The reset sub-circuit includes a first reset sub-circuit 10221. The first reset sub-circuit 10221 is connected to the control terminal of the drive sub-circuit 10223, an initial signal line Vinit1 and a reset signal line RST, and is configured to apply an initial voltage provided by the initial signal line to the second terminal of the drive sub-circuit 10223 in response to a reset control signal provided by the reset signal line RST.

The reset sub-circuit further includes a second reset sub-circuit 10227. The second reset sub-circuit 10227 is connected to an initial signal line Vinit2, the first gate scanning signal line GP and the anode of the light-emitting unit 1021, and is configured to apply an initial voltage provided by the initial signal line Vinit2 to the first terminal of the light-emitting unit 1021 in response to the control signal provided by the first gate scanning signal line GP. The cathode of the light-emitting unit 1021 is connected to the first power line 115 (VSS trace).

The light emission control sub-circuit includes a first light emission control sub-circuit 10225. The first light emission control sub-circuit 10225 is connected to the VDD trace, the first terminal of the drive sub-circuit 10223 and a light emission control signal line E, and is configured to apply a first voltage provided by the VDD trace to the first terminal of the drive sub-circuit in response to a light emission control signal provided by the light emission control signal line E.

The light emission control sub-circuit further includes a second light emission control sub-circuit 10226. The second light emission control sub-circuit 10226 is connected to the second terminal of the drive sub-circuit 10223, the anode of the light-emitting unit 1021 and the light emission control signal line E, and is configured to enable the drive current to be applied to the anode of the light-emitting unit 1021 in response to the light emission control signal provided by the light emission control signal line E.

In the embodiments of the present disclosure, the display panel 10 further includes a first voltage signal line Evgh (not shown in FIG. 1) and a second voltage signal line Evg1 (not shown in FIG. 1) that are disposed in the peripheral region 101*b*. The first voltage signal line Evgh is configured to provide a first voltage, and the second voltage signal line Evg1 is configured to provide a second voltage. The second voltage is lower than the first voltage. The EM GOA circuit is connected to the first voltage signal line Evgh to output the first voltage as a first portion of the light emission control signal. For example, the first voltage signal line Evgh is connected to a plurality of shift register units in the EM GOA circuit. The first portion of the light emission control signal is, for example, a high-level portion of the light emission control signal. For example, the high-level portion of the light emission control signal can enable the first light emission control transistor BT5 and the second light emission control transistor BT6 to be turned off in a non-light-emitting phase. The EM GOA circuit is further connected to the second voltage signal line Evg1 to output a second voltage as a second portion of the light emission control signal. For example, the second voltage signal line Evg1 is connected to a plurality of shift register units in the EM GOA circuit. The second portion of the light emission control signal is, for example, a low-level portion of the light emission control signal. For example, the low-level portion of the light emission control signal can enable the first light emission control transistor BT5 and the second light emission control transistor BT6 to be turned on in a light-emitting phase.

Figure 13:
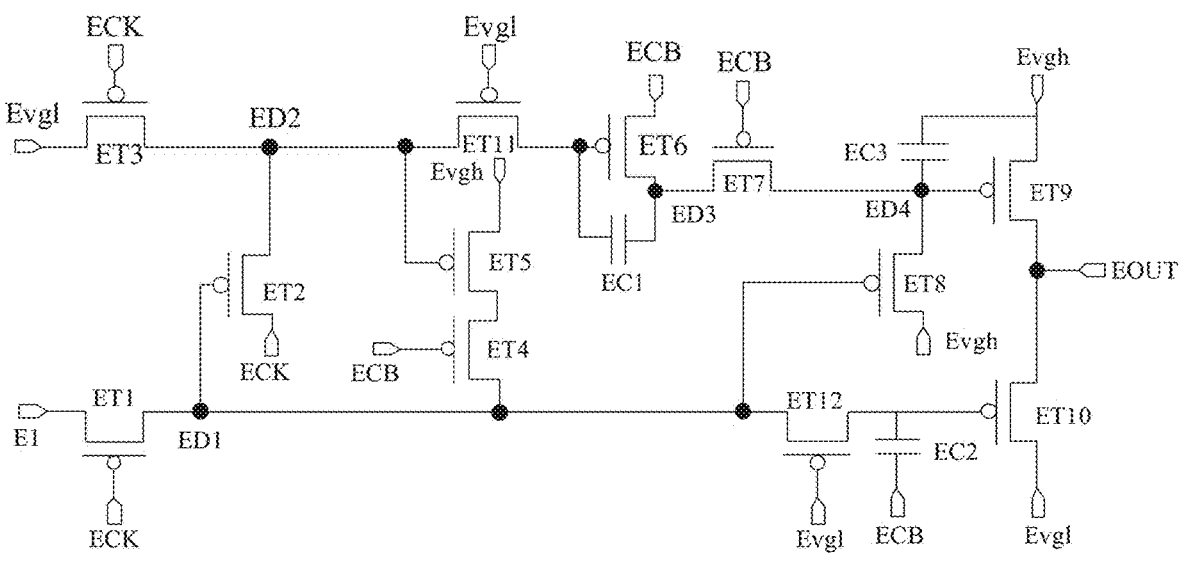
FIG. 13 is an equivalent circuit diagram of a shift register unit according to some embodiments of the present disclosure.
Figure 14:
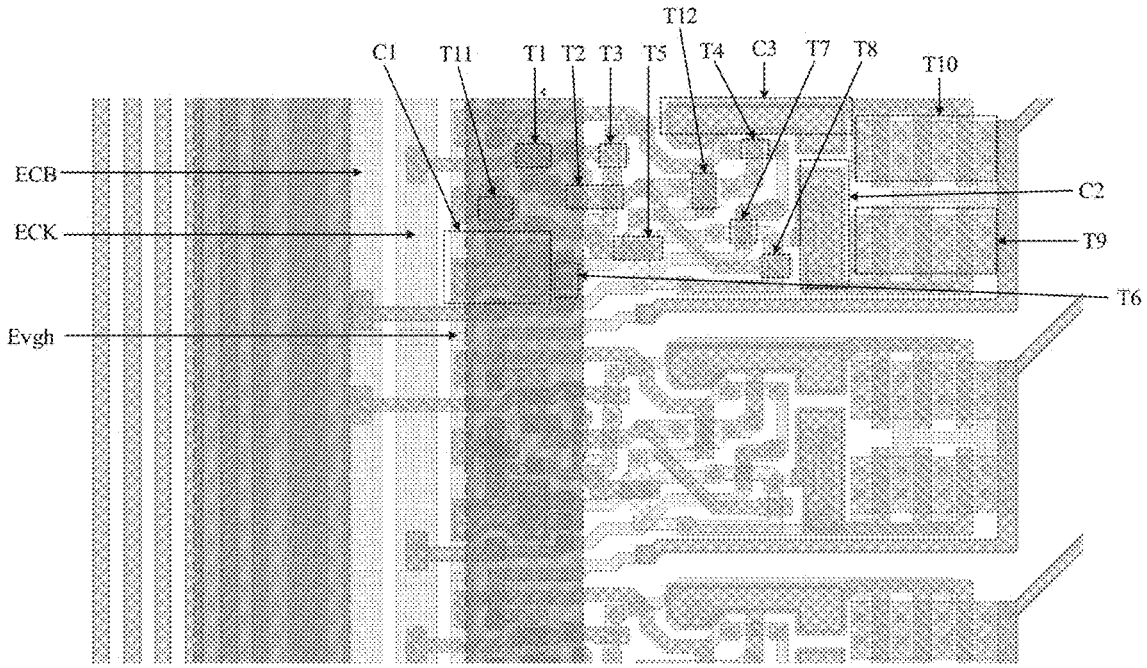
FIG. 14 is a layout diagram of the shift register unit shown in FIG. 13 on a display panel.

FIG. 13 is an equivalent circuit diagram of a shift register unit according to some embodiments of the present disclosure. FIG. 14 is a layout diagram of the shift register unit shown in FIG. 13 on a display panel. The shift register unit is briefly described below with reference to FIG. 13 and FIG. 14.

As shown in FIG. 13 and FIG. 14, the shift register unit includes 12 transistors (a first transistor ET1, a second transistor ET2, a third transistor ET3, a fourth transistor ET4, a fifth transistor ET5, a sixth transistor ET6, a seventh transistor ET7, an eighth transistor ET8, a ninth transistor ET9 (which is also referred to as an output transistor), a tenth transistor ET10 (which is referred to as an output control transistor or as an output transistor, which is not limited in the embodiments of the present disclosure), an eleventh transistor ET11 and a twelfth transistor ET12), and three capacitors (a first capacitor EC1, a second capacitor EC2 and a third capacitor EC3). In some embodiments, the shift register unit is a 10T3C circuit which does not include the eleventh transistor ET11 and the twelfth transistor ET12

When the plurality of shift register units are cascaded, the second electrode of the first transistor ET1 of the first stage of shift register unit is connected to an input terminal EI, the input terminal EI is configured to be connected to a trigger signal line ESTV to receive a trigger signal as an input signal, and the second electrode of the first transistor ET1 of each of the other stages of shift register units is electrically connected to the output terminal of the previous stage of shift register unit to receive the output signal output from the output terminal EOUT of the previous stage of shift register unit as an input signal, thereby achieving shift output to provide, for example, light emission control signals shifted row by row for the pixel units 102 arranged in an array in the display region 101*a*. For example, the following is described by taking the ninth transistor ET9 as an output transistor.

As shown in FIG. 13 and FIG. 14, the shift register unit f0 further includes a first clock signal terminal ECK and a second clock signal terminal ECB. ECK further represents a first clock signal line, and ECB further represents a second clock signal line. For example, the first clock signal and the second clock signal adopt pulse signals having a duty ratio greater than 50%, and, for example, the two clock signals have a phase difference of a half period.

Evgh represents the first voltage signal line and the first voltage provided by the first voltage signal line, Evg1 represents the second voltage signal line and the second voltage provided by the second voltage signal line. The second voltage is lower than the first voltage. For example, the first voltage is a direct current (DC) high level, and the second voltage is a DC low level.

As shown in FIG. 13 and FIG. 14, the gate of the first transistor ET1 is connected to the first clock signal terminal ECK (the first clock signal terminal is connected to the first clock signal line ECK) to receive the first clock signal, the second electrode of the first transistor ET1 is connected to the input terminal EI, and the first electrode of the first transistor ET1 is connected to a first node ED1. For example, when the shift register unit is the first stage of shift register unit, the input terminal EI is connected to the trigger signal line ESTV to receive the trigger signal; and when the shift register unit is another stage of shift register unit other than the first stage of shift register unit, the input terminal EI is connected to the output terminal EOUT of the previous stage of shift register unit.

The gate of the second transistor ET2 is connected to the first node ED1, the first electrode of the second transistor ET2 is connected to a second node ED2, and the second electrode of the second transistor ET2 is connected to the first clock signal terminal ECK to receive the first clock signal.

The gate of the third transistor ET3 is connected to the first clock signal terminal ECK to receive the first clock signal, the first electrode of the third transistor ET3 is connected to the second node ED2, and the second electrode of the third transistor ET3 is connected to the second voltage signal line Evg1 to receive the second voltage.

The gate of the fourth transistor ET4 is connected to the second clock signal terminal ECB (for example, the second clock signal terminal ECB is connected to the second clock signal line ECB) to receive the second clock signal, the first electrode of the fourth transistor ET4 is connected to the first node ED1, and the second electrode of the fourth transistor ET4 is connected to the second electrode of the fifth transistor ET5.

The gate of the fifth transistor ET5 is connected to the second node ED2, and the first electrode of the fifth transistor ET5 is connected to the first voltage signal line Evgh to receive the first voltage.

The gate of the sixth transistor ET6 is connected to the second electrode of the eleventh transistor ET11, the first electrode of the sixth transistor ET6 is connected to the second clock signal terminal ECB to receive the second clock signal, and the second electrode of the sixth transistor ET6 is connected to the third node ED3.

The first electrode of the first capacitor EC1 is connected to the second electrode of the eleventh transistor ET11, and the second electrode of the first capacitor EC1 is connected to the third node ED3.

The gate of the seventh transistor ET7 is connected to the second clock signal terminal ECB to receive the second clock signal, the first electrode of the seventh transistor ET7 is connected to the third node ED3, and the second electrode of the seventh transistor ET7 is connected to the fourth node ED4.

The gate of the eighth transistor ET8 is connected to the first node ED1, the first electrode of the eighth transistor ET8 is connected to the fourth node ED4, and the second electrode of the eighth transistor ET8 is connected to the first voltage signal line Evgh to receive the first voltage.

The gate of the output transistor ET9 is connected to the fourth node ED4, the first electrode of the output transistor ET9 is connected to the first voltage signal line Evgh to receive the first voltage, and the second electrode of the output transistor ET9 is connected to the output terminal EOUT.

The first electrode of the third capacitor EC3 is connected to the fourth node ED4, and the second electrode of the third capacitor EC3 is connected to the first voltage signal line Evgh to receive the first voltage.

The gate of the tenth transistor ET10 is connected to the second electrode of the twelfth transistor ET12, the first electrode of the tenth transistor ET10 is connected to the second voltage signal line Evg1 to receive the second voltage, and the second electrode of the tenth transistor ET10 is connected to the output terminal EOUT.

The first electrode of the second capacitor EC2 is connected to the second electrode of the twelfth transistor ET12, and the second electrode of the second capacitor EC2 is connected to the second clock signal terminal ECB to receive the second clock signal.

The gate of the eleventh transistor ET11 is connected to the second voltage signal line Evg1 to receive the second voltage, and the first electrode of the eleventh transistor ET11 is connected to the second node ED2.

The gate of the twelfth transistor ET12 is connected to the second voltage signal line Evg1 to receive the second voltage, and the first electrode of the twelfth transistor ET12 is connected to the first node ED1.

As shown in FIG. 14, the signal lines ECB, ECK, Evg1 (not shown in FIG. 14), Evgh are arranged in a first direction (for example, an X-axis direction), and all extend in a second direction (for example, a Y-axis direction).

The transistors in the shift register unit shown in FIG. 14 are all described by taking P-type transistors as an example, that is, each transistor is turned on when the gate is at a low level (turn-on level), and is turned off when the gate is at a high level (turn-off level). In this case, the first electrode of the transistor is the source, and the second electrode of the transistor is the drain.

The configuration of the shift register unit includes, but is not limited to, the configuration of FIG. 13. For example, the shift register unit does not include ET11 and ET12, or a transistor having a function similar to that of ET11 or ET12 is disposed at ED3 or ED4, and the transistors are also N-type transistors or a mixture of P-type transistors and N-type transistors as long as the electrodes of each transistor of the selected type are connected in the manner in which the electrodes of the corresponding transistor in the embodiments of the present are connected. The layout shown in FIG. 14 is merely an example, and the layout of the shift register unit in the display panel is determined according to actual requirements, which is not limited in the embodiments of the present disclosure.

Referring to FIG. 1, the display panel 10 further includes a power drive circuit 119. The power drive circuit 119 is disposed in the peripheral region 101b and is disposed on a side away from the barrier structure 103 of the first portion 1151 of the first power line 115. For example, the power drive circuit 119 is disposed in the first region 101b1 of the peripheral region 101b.

The power drive circuit 119 is connected to the first portion 1151 of the first power line 115 and is configured to provide a first power signal for the first power line 115, such that the first power line 115 provides the first power signal from the power drive circuit 119 for the cathode layers a3 of the plurality of pixel units 102. In addition, the power drive circuit 119 is further connected to the second power line 116 and is configured to provide a second power signal to the second power line 116, such that the second power line 116 provides the second power signal from the power drive circuit 119 for the plurality of pixel units 102.

For example, FIG. 1 shows one first power line 115 which includes two first portions 1151, and shows two second power lines 116. The power drive circuit 119 is connected to the two first portions 1151 and the two second power lines 116.

In the embodiments of the present disclosure, referring to FIG. 10, the display panel 10 further includes an encapsulation film layer 120. The encapsulation film layer 120 is disposed on the side of each of the plurality of pixel units 102 away from the base substrate 101, and the encapsulation film layer 120 covers the region enclosed by the barrier structure 103. Referring to FIG. 10, the boundary of the region covered by the encapsulation film layer 120 is disposed on the side of the barrier structure 103 away from the plurality of pixel units 102.

In the embodiments of the present disclosure, the encapsulation film layer 120 includes a first film layer 1201, a second film layer 1202, and a third film layer 1203 that are stacked along a direction going away from the base substrate 101.

In some embodiments, the first film layer 1201 and the third film layer 1203 are made from an inorganic material, and the second film layer 1202 is made from an organic material. For example, the first film layer 1201 and the third film layer 1203 are made from one or more inorganic oxides of SiNx (silicon nitride). SiOx (silicon oxide), and SiOxNy (silicon oxynitride), and the second film layer 1202 is made from a resin material. The resin is thermoplastic resin or thermosetting resin. The thermoplastic resin includes acrylic (PMMA) resin, and the thermosetting resin includes epoxy resin.

It should be noted that the second film layer 1202 is disposed in the region enclosed by the barrier structure 103, and the first film layer 1201 and the third film layer 1203 cover the region enclosed by the barrier structure 103 and cover the barrier structure 103. That is, the orthographic projection of the barrier structure 103 on the base substrate 101 is within the region covered by the encapsulation film layer 120, which ensures that the encapsulation film layer 120 can effectively encapsulate each structure disposed in the region enclosed by the barrier structure 103.

In the embodiments of the present disclosure, the second film layer 1202 is manufactured by inkjet printing (IJP), and the first film layer 1201 and the third film layer 1203 are manufactured by chemical vapor deposition (CVD).

In summary: the embodiments of the present disclosure provide a display panel including a base substrate, a plurality of pixel units, a barrier structure, a connecting structure, a first insulating layer, a circuit structure, a second insulating layer, and a protection layer. The first insulating layer is disposed between the first circuit pattern and the second circuit pattern of the circuit structure and is provided with a via hole, and the first circuit pattern and the second circuit pattern are electrically connected through the via hole. The orthographic projection of the connecting structure on the base substrate is not overlapped with the orthographic projection of the via hole on the base substrate; and/or the orthographic projection of the protection layer on the base substrate covers the orthographic projection of the via hole on the base substrate. Therefore, the second insulating layer at the via hole can be prevented from being over-etched, or even if the second insulating layer at the via hole is over-etched, the connecting structure and the second circuit pattern of the circuit structure can be prevented from being short-circuited, thereby ensuring the yield of the display panel.

Figure 15:
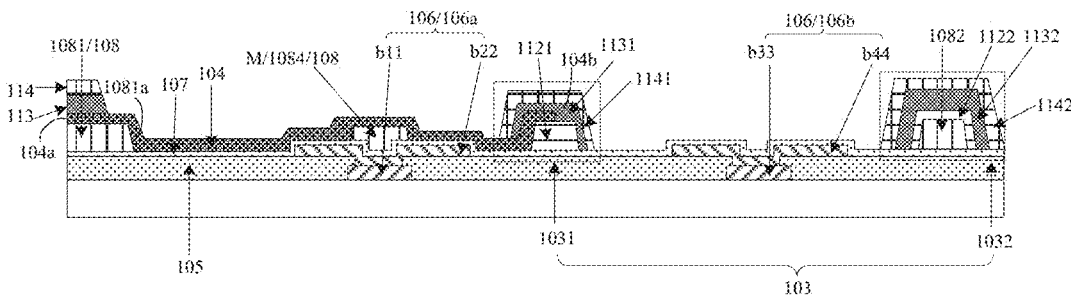
FIG. 15 is a partial sectional view of yet another display panel in a peripheral region according to some embodiments of the present disclosure.

FIG. 15 is a partial sectional view of yet another display panel in the peripheral region according to some embodiments of the present disclosure. Referring to FIG. 15, the display panel 10 includes a base substrate 101, a plurality of pixel units (not shown in FIG. 15, please refer to FIG. 1), a barrier structure 103, a connecting structure 104, a first insulating layer 105, a circuit structure 106, a second insulating layer 107, a third insulating layer 108 and a protection layer M.

With reference to FIG. 1, FIG. 3 and FIG. 15, the plurality of pixel units 102 are disposed in the display region 101a, and the barrier structure 103, the connecting structure 104 and the circuit structure 106 are all disposed in the peripheral region 101b.

Referring to FIG. 4, the pixel unit 102 includes a light-emitting unit 1021. The light-emitting unit 1021 includes a first electrode layer a1, a light-emitting layer a2 and a second electrode layer a3 stacked in sequence. For example, the first electrode layer a1 is an anode layer, and the second electrode layer a3 is a cathode layer.

With reference to FIG. 1, FIG. 3, and FIG. 15, the barrier structure 103 surrounds the plurality of pixel units 102. The edge away from the display region 101a of the orthographic projection of the connecting structure 104 on the base substrate 101 is closer to the display region 101a than the edge away from the display region 101a of the orthographic projection of the barrier structure 103 on the base substrate 101 is. The connecting structure 104 and the first electrode layer a1 are disposed in the same layer and are spaced apart from each other, and the connecting structure 104 is electrically connected to the second electrode layer a3. That is, the connecting structure 104 and the first electrode layer a1 are made of the same material and are manufactured by a single patterning process. The signal transmitted by the connecting structure 104 is the same as the signal transmitted by the second electrode layer a3.

Referring to FIG. 15, the circuit structure 106 is disposed in the peripheral region 101b, and the circuit structure 106 includes a first circuit structure 106a. The first circuit structure 106a includes a first circuit sub-pattern b11 and a second circuit sub-pattern b22. The first circuit sub-pattern b11 is disposed in the first metal layer, and the second circuit sub-pattern b22 is disposed in the second metal layer. The first insulating layer 105 in the display panel 10 is disposed between the first metal layer and the second metal layer. A via hole (including the first via hole c1) is formed in the portion of the first insulating layer 105 which is disposed in the peripheral region 101b, and the first circuit sub-pattern b11 and the second circuit sub-pattern b22 are electrically connected to each other through the first via hole c1. The second insulating layer 107 is disposed on the side of the second metal layer away from the base substrate 101, and is configured to insulate the second circuit sub-pattern b22 in the second metal layer from the connecting structure 104 which is disposed in the same layer as the first electrode layer a1.

In the embodiments of the present disclosure, the third insulating layer 108 includes a body pattern 1081 disposed in the display region 101a and the peripheral region 101b, and the body pattern 1081 includes a third side surface 1081a disposed in the peripheral region 101b. The orthographic projection of the third side surface 1081a on the base substrate 101 is between the barrier structure 103 and the display region 101a. That is, the orthographic projection of the body pattern 1081 on the base substrate 101 is not overlapped with the orthographic projection of the first circuit structure 106a on the base substrate 101.

Therefore, in order to prevent the connecting structure 104 and the second circuit sub-pattern b22 of the first circuit structure 106a from being short-circuited, the orthographic projection of the protection pattern of the protection layer M on the base substrate 101 covers the orthographic projection of the first via hole c1 on the base substrate 101.

The protection layer M is disposed between the first metal layer and the base substrate 101, or the protection layer M is disposed on the side of the second insulating layer 107 away from the base substrate 101, which can prevent the second insulating layer 107 at the first via hole c1 from being over-etched or prevent the connecting structure 104 and the second circuit sub-pattern b22 of the first circuit structure 106 from being short-circuited even if the second insulating layer 107 at the first via hole c1 is the over-etched, thereby ensuring the yield of the display panel 10.

In summary, the embodiments of the present disclosure provide a display panel including a base substrate, a plurality of pixel units, a barrier structure, a connecting structure, a first insulating layer, a circuit structure, a second insulating layer, a third insulating layer and a protection layer. The first insulating layer is disposed between the first circuit sub-pattern and the second circuit sub-pattern of the first circuit structure and is provided with a first via hole, and the first circuit sub-pattern and the second circuit sub-pattern are electrically connected through the first via hole. Since the orthographic projection of the third insulating layer on the base substrate is not overlapped with the orthographic projection of the first via hole on the base substrate, by making the protection pattern of the protection layer cover the first via hole, the second insulating layer at the via hole can be prevented from being over-etched, or even if the second insulating layer at the via hole is over-etched, the connecting structure and the second circuit sub-pattern of the first circuit structure can be prevented from being short-circuited, thereby ensuring the yield of the display panel.

As an optional implementation, referring to FIG. 15, the connecting structure 104 has a first side surface 104a and a second side surface 104b opposite to each other, and the first side surface 104a is closer to the plurality of pixel units 102 than the second side surface 104b is. The orthographic projection of the second side surface 104b on the base substrate 101 is within the orthographic projection of the first barrier dam 1031 on the base substrate 101, and the orthographic projection of the connecting structure 104 on the base substrate 101 is not overlapped with the orthographic projection of the second barrier dam 1032 on the base substrate 101. That is, the connecting structure 104 is disposed in a region between the first barrier dam 1031 and the display region 101a, but is not disposed in a region between the first barrier dam 1031 and the second barrier dam 1032.

In this implementation, since the orthographic projection of the second side surface 104b(boundary) of the connecting structure 104 on the base substrate 101 is within the orthographic projection of the first barrier dam 1031 on the base substrate 101, there is a short circuit risk between the connecting structure 104 and the second circuit sub-pattern b22 of the first circuit structure 106a, but there is no short circuit risk between the connecting structure 104 and the fourth circuit sub-pattern b44 of the second circuit structure 106b.

In addition, in the embodiments of the present disclosure, since the orthographic projection of the protection pattern of the protection layer M on the base substrate 101 covers the orthographic projection of the second circuit sub-pattern b22 on the base substrate 101, the connecting structure 104 and the second circuit sub-pattern b22 can be prevented from being short-circuited.

The protection layer M is disposed between the first metal layer and the base substrate 101, or the protection layer M is disposed on the side of the second insulating layer 107 away from the base substrate 101. Therefore, by providing the protection layer M, the second insulating layer 107 at the first via hole c1 can be prevented from being over-etched, or even if the second insulating layer 107 at the first via hole c1 is over-etched, the connecting structure 104 and the second circuit sub-pattern b22 of the first circuit structure 106a can be prevented from being short-circuited, thereby ensuring the yield of the display panel 10.

In the embodiments of the present disclosure, the protection layer M has the following optional implementations.

First solution, referring to FIG. 15, the plurality of protection patterns included in the protection layer M are disposed in the third insulating layer 108. That is, the plurality of protection patterns of the protection layer M and the body pattern 1081 of the third insulating layer 108 are made of the same material and are manufactured by a single patterning process. For example, in FIG. 15, the ninth insulating pattern 1084 included in the third insulating layer 108 is the protection pattern.

That is, a ninth insulating pattern is provided on the second insulating layer 107 at the first via hole c1, and the ninth insulating pattern functions to insulate the connecting structure 104 from the second circuit sub-pattern b22. In this way, even if the second insulating layer 107 at the first via hole c1 is over-etched (e.g., the second circuit sub-pattern b22 of the first circuit structure 106a is exposed due to the over-etching of the second insulating layer 107), since the ninth insulating pattern 1084 of the third insulating layer 108 covers the over-etched region of the second insulating layer 107, the connecting structure 104 and the second circuit sub-pattern b22 can be prevented from being short circuited, thereby ensuring the yield of the display panel 10.

Figure 16:
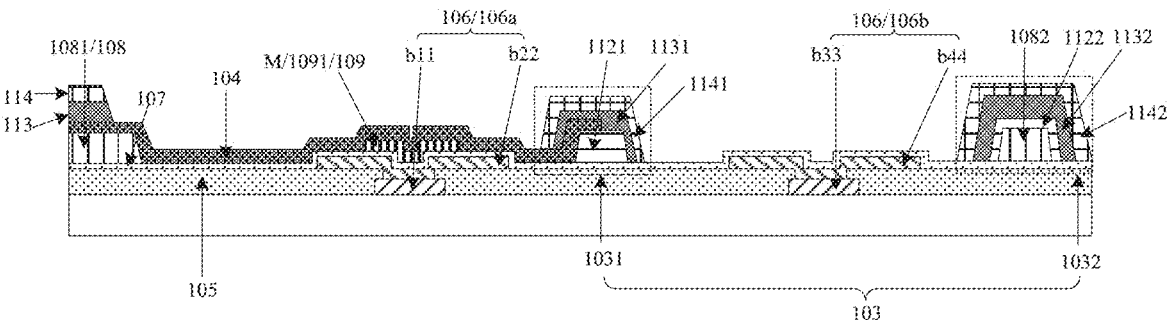
FIG. 16 is a partial sectional view of yet another display panel in a peripheral region according to some embodiments of the present disclosure.

Second solution, referring to FIG. 16, the protection layer M is a third metal layer 109 disposed on the side of the second insulating layer 107 away from the base substrate 101. The plurality of metal patterns 1091 included in the third metal layer 109 are the protection patterns. The orthographic projection of the metal pattern 1091 on the base substrate 101 covers the orthographic projection of the first via hole c1 on the base substrate 101.

Here, the third metal layer 109 is a second source-drain electrode layer of the display panel. Generally, the third metal layer 109 is not disposed in the peripheral region 101b. Therefore, when a third metal film for forming the third metal layer 109 is etched by using an etching solution, the portion of the third metal film which is disposed in the peripheral region 101b needs to be etched away. However, in the process of etching the third metal film, the etching solution easily collects in the via hole (the first via hole c1 or the second via hole c2), which causes the portion of the second insulating layer 107 which is disposed at the via hole to be over-etched.

In this solution of the embodiments of the present disclosure, the metal pattern 1091 of the third metal layer 109 which is disposed in the first via hole c1 is retained. Therefore, when the third metal film is etched, the third metal film disposed in the first via hole c1 does not need to be etched away, and thus the etching solution does not collect in the first via hole c1, thereby preventing the second insulating layer 107 at the first via hole c1 from being over-etched. Furthermore, the connecting structure 104 and the second circuit sub-pattern b22 of the first circuit structure 106a can be prevented from being short-circuited. In addition, since the orthographic projection of the connecting structure 104 on the base substrate 101 is not overlapped with the orthographic projection of the second circuit structure 106b on the base substrate 101, there is no short circuit risk between the connecting structure 104 and the fourth circuit sub-pattern b44 of the second circuit structure 106b.

Therefore, there is no short circuit risk at the first via hole c1 and the second via hole c2, thereby ensuring the yield of the display panel 10.

In the embodiments of the present disclosure, since the metal pattern 1091 of the third metal layer 109 has a conductive capability, a signal line is provided to be connected to the metal pattern 1091, so as to provide a fixed voltage for the metal pattern 1091. Certainly, when the signal line is provided, the display panel has more traces, and thus the layout design is difficult. Therefore, the metal pattern 1091 is directly designed as a floating pattern, without providing a fixed voltage for the metal pattern 1091.

Figure 17:
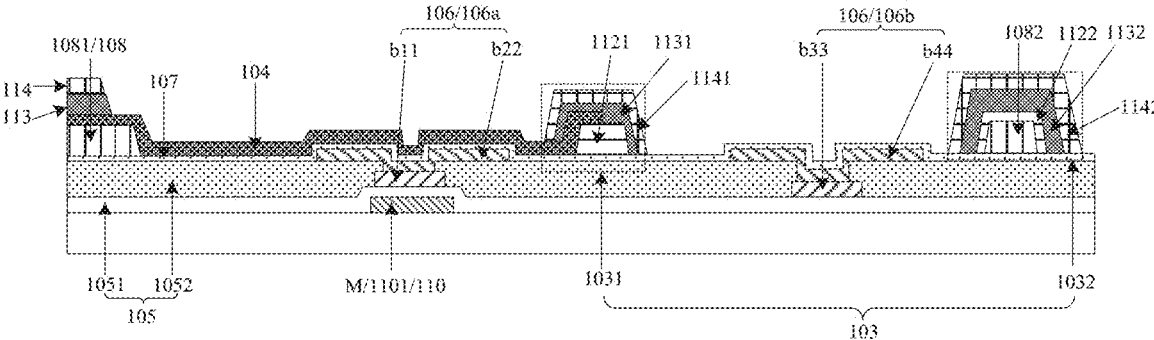
FIG. 17 is a partial sectional view of yet another display panel in a peripheral region according to some embodiments of the present disclosure.

Third solution, referring to FIG. 17, the protection layer M is an active layer 110 disposed between the base substrate 101 and the first metal layer. The plurality of active patterns 1101 included in the active layer 110 are the protection patterns. The orthographic projection of the active pattern 1101 on the base substrate 101 covers the orthographic projection of the first via hole c1 on the base substrate 101.

In this solution of the embodiments of the present disclosure, since the active layer 110 is disposed on the side of the first metal layer close to the base substrate 101, by providing the active pattern 1101 at the first via hole c1, the distance between the first circuit sub-pattern b11 and the second circuit sub-pattern b22 which are disposed on the side of the active pattern 1101 away from the base substrate 101 is relatively close, and thus the first insulating layer 105 is relatively thin at the positions of the first circuit sub-pattern b11 and the second circuit sub-pattern b22. Therefore, the depth of the first via hole c1 formed in the first insulating layer 105 is reduced. Since the first via hole c1 in the first insulating layer 105 has a small depth, the degree of collection of the etching solution can be reduced, and the probability of over-etching the second insulating layer 107 at the first via hole c1 is reduced, thereby preventing the connecting structure 104 and the second circuit sub-pattern b22 from being short-circuited. In addition, since the orthographic projection of the connecting structure 104 on the base substrate 101 is not overlapped with the orthographic projection of the second circuit structure 106b on the base substrate 101, there is no short circuit risk between the connecting structure 104 and the fourth circuit sub-pattern b44 of the second circuit structure 106b. Therefore, there is no short circuit risk at the first via hole c1 and the second via hole c2, thereby ensuring the yield of the display panel.

It should be noted that in the third solution, the first insulating layer 105 includes a first sub-insulating layer 1051 and a second sub-insulating layer 1052. The first sub-insulating layer 1051 is disposed between the active layer and the first metal layer, and the second sub-insulating layer 1052 is disposed between the first metal layer and the second metal layer.

Figure 18:
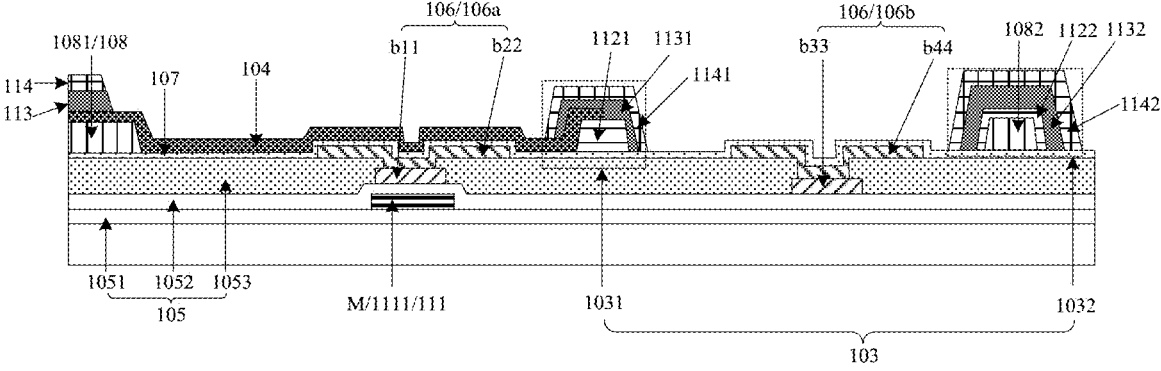
FIG. 18 is a partial sectional view of yet another display panel in a peripheral region according to some embodiments of the present disclosure.

Fourth solution, referring to FIG. 18, the protection layer M is a light-shielding layer 111 disposed between the base substrate 101 and the first metal layer. The plurality of light-shielding patterns 1111 included in the light-shielding layer 111 are the protection patterns. The orthographic projection of the light-shielding pattern 1111 on the base substrate 101 covers the orthographic projection of the first via hole c1 on the base substrate 101.

In this solution of the embodiments of the present disclosure, since the light-shielding layer 111 is disposed on the side of the first metal layer close to the base substrate 101, by providing the light-shielding pattern at the first via hole c1, the distance between the first circuit sub-pattern b11 and the second circuit sub-pattern b22 which are disposed on the side of the light-shielding pattern 1111 away from the base substrate 101 is relatively close, and thus the first insulating layer 105 is relatively thin at the positions of the first circuit sub-pattern b11 and the second circuit sub-pattern b22. Therefore, the depth of the first via hole c1 formed in the first insulating layer 105 is reduced. Since the first via hole c1 in the first insulating layer 105 has a small depth, the degree of collection of the etching solution can be reduced, and the probability of over-etching the second insulating layer 107 at the first via hole c1 can be reduced, thereby preventing the connecting structure 104 and the second circuit sub-pattern b22 from being short-circuited. In addition, since the orthographic projection of the connecting structure 104 on the base substrate 101 is not overlapped with the orthographic projection of the second circuit structure 106b on the base substrate 101, there is no short circuit risk between the connecting structure 104 and the fourth circuit sub-pattern b44 of the second circuit structure 106b. Therefore, there is no short circuit risk at the first via hole c1 and the second via hole c2, thereby ensuring the yield of the display panel.

It should be noted that in the fourth solution, the first insulating layer 105 includes a first sub-insulating layer 1051, a second sub-insulating layer 1052 and a third sub-insulating layer 1053. The first sub-insulating layer 1051 is disposed between the base substrate 101 and the light-shielding layer 111, the second sub-insulating layer 1052 is disposed between the light-shielding layer 111 and the first metal layer, and the third sub-insulating layer 1053 is disposed between the first metal layer and the second metal layer.

Figure 19:
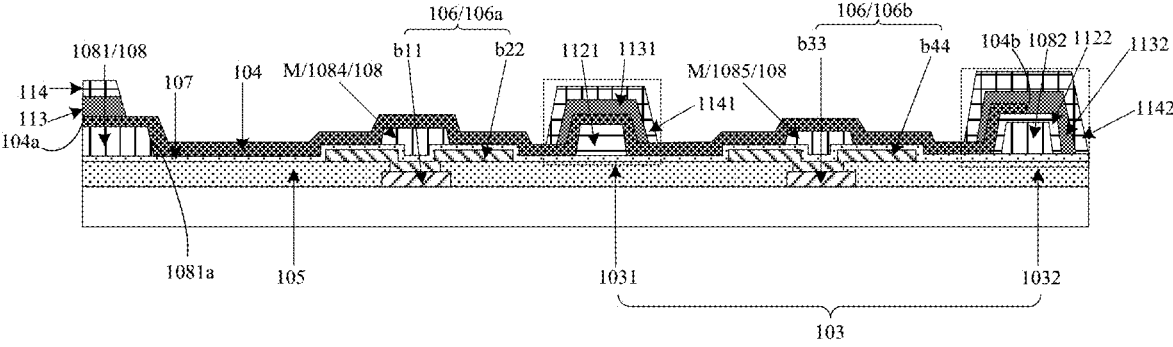
FIG. 19 is a partial sectional view of yet another display panel in a peripheral region according to some embodiments of the present disclosure.

As another optional implementation, referring to FIG. 19, the connecting structure 104 has a first side surface 104a and a second side surface 104b opposite to each other, and the first side surface 104a is closer to the plurality of pixel units 102 than the second side surface 104b is. The orthographic projection of the second side surface 104b on the base substrate 101 is within the orthographic projection of the second barrier dam 1032 on the base substrate 101, and the orthographic projection of the connecting structure 104 on the base substrate 101 is overlapped with the orthographic projection of the first barrier dam 1031 on the base substrate 101. That is, the connecting structure 104 is disposed in a region between the first barrier dam 1031 and the display region 101a, and is also disposed in a region between the first barrier dam 1031 and the second barrier dam 1032.

In this implementation, since the orthographic projection of the second side surface 104b(boundary) of the connecting structure 104 on the base substrate 101 is within the orthographic projection of the second barrier dam 1032 on the base substrate 101, there is a short circuit risk between the connecting structure 104 and the second circuit sub-pattern b22 of the first circuit structure 106a and between the connecting structure 104 and the fourth circuit sub-pattern b44 of the second circuit structure 106b. Thus, in order to prevent the connecting structure 104 from being short-circuited with the second circuit sub-pattern b22 of the first circuit structure 106a and the fourth circuit sub-pattern b44 of the second circuit structure 106b, the protection layer M includes a plurality of first protection patterns and a plurality of second protection patterns. The orthographic projection of the first protection pattern on the base substrate 101 covers the orthographic projection of the first via hole c1 on the base substrate 101, and the orthographic projection of the second protection pattern on the base substrate 101 covers the orthographic projection of the second via hole c2 on the base substrate 101.

The protection layer M is disposed between the first metal layer and the base substrate 101, or the protection layer M is disposed on the side of the second insulating layer 107 away from the base substrate 101. Therefore, by providing the protection layer M, the second insulating layer 107 at the first via hole c1 and the second via hole c2 can be prevented from being over-etched, or even if the second insulating layer 107 at the first via hole c1 and the second via hole c2 is over-etched, the connecting structure 104 and the circuit structures can be prevented from being short-circuited, thereby ensuring the yield of the display panel 10.

In the embodiments of the present disclosure, the protection layer M has the following optional implementations.

Figure 20:
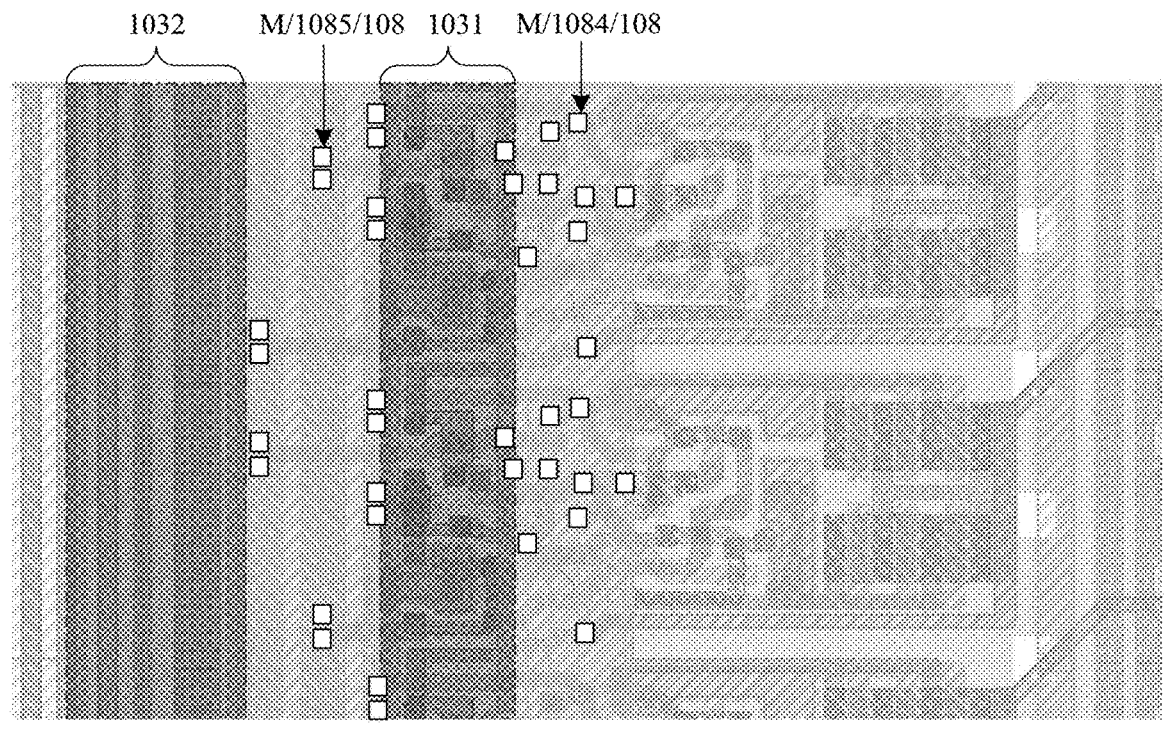
FIG. 20 is a partial schematic diagram of a display panel in a peripheral region according to some embodiments of the present disclosure.

First solution, referring to FIG. 19 and FIG. 20, the plurality of protection patterns included in the protection layer M are disposed in the third insulating layer 108. That is, the plurality of protection patterns of the protection layer M and the body pattern 1081 of the third insulating layer 108 are made of the same material and are manufactured by a single patterning process. For example, in FIG. 19, the ninth insulating pattern 1084 included in the third insulating layer 108 is the first protection pattern, and the tenth insulating pattern 1085 is the second protection pattern.

That is, a ninth insulating pattern is provided on the second insulating layer 107 at the first via hole c1, and a tenth insulating pattern is provided on the second insulating layer 107 at the second via hole c2. The ninth insulating pattern functions to insulate the connecting structure 104 from the second circuit sub-pattern b22, and the tenth insulating pattern functions to insulate the connecting structure 104 from the fourth circuit sub-pattern b44. Therefore, even if the second insulating layer 107 at the first via hole c1 and the second via hole c2 is over-etched (for example, the second circuit sub-pattern b22 of the first circuit structure 106a and the fourth circuit sub-pattern b44 of the second circuit structure 106b are exposed due to the over-etching of the second insulating layer 107), since the ninth insulating pattern 1084 and the tenth insulating pattern 1085 of the third insulating layer 108 cover the over-etched regions of the second insulating layer 107, the connecting structure 104 is prevented from being short-circuited with the second circuit sub-pattern b22 and the fourth circuit sub-pattern b44, thereby ensuring the yield of the display panel 10.

Figure 21:
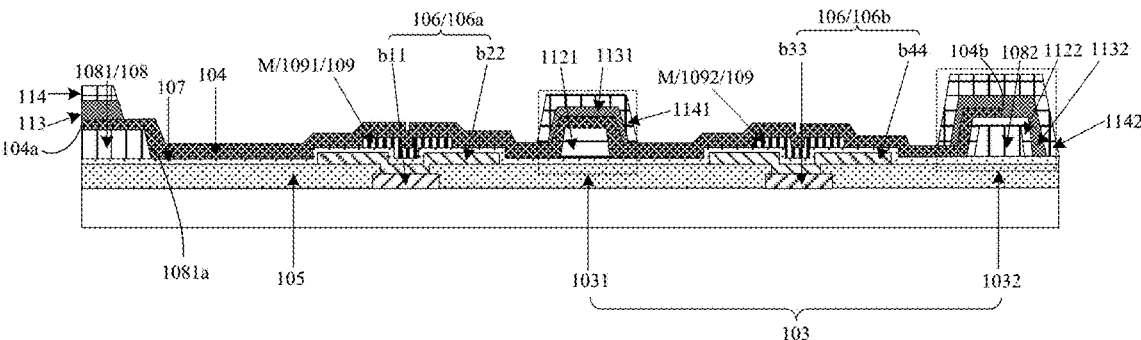
FIG. 21 is a partial sectional view of yet another display panel in a peripheral region according to some embodiments of the present disclosure.

Second solution, referring to FIG. 21, the protection layer M is a third metal layer 109 disposed on the side of the second insulating layer 107 away from the base substrate 101. The third metal layer 109 includes a plurality of first metal patterns 1091 and a plurality of second metal patterns 1092. The first metal patterns 1091 are the first protection patterns, and the second metal patterns 1092 are the second protection patterns. The orthographic projection of the first metal pattern 1091 on the base substrate 101 covers the orthographic projection of the first via hole c1 on the base substrate 101, and the orthographic projection of the second metal pattern 1092 on the base substrate 101 covers the orthographic projection of the second via hole c2 on the base substrate 101.

The third metal layer 109 is a second source-drain electrode layer of the display panel. Generally, the third metal layer 109 is not disposed in the peripheral region 101b. Therefore, when a third metal film for forming the third metal layer 109 is etched by using an etching solution, the portion of the third metal film which is disposed in the peripheral region 101b needs to be etched away. However, in the process of etching the third metal film, the etching solution easily collects in the via hole (the first via hole c1 or the second via hole c2), which causes the portion of the second insulating layer 107 which is disposed at the via hole to be over-etched.

In this solution of the embodiments of the present disclosure, the first metal pattern 1091 disposed at the first via hole c1 and the second metal pattern 1092 disposed at the second via hole c2 of the third metal layer 109 are retained. Therefore, when the third metal film is etched, the third metal film disposed in the first via hole c1 and the second via hole c2 does not need to be etched away, and thus the etching solution does not collect in the first via hole c1 and the second via hole c2, thereby preventing the second insulating layer 107 at the first via hole c1 and the second via hole c2 from being over-etched. Furthermore, the connecting structure 104 is prevented from being short-circuited with the second circuit sub-pattern b22 of the first circuit structure 106a and the fourth circuit sub-pattern b44 of the second circuit structure 106b. Therefore, there is no short circuit risk at the first via hole c1 and the second via hole c2, thereby ensuring the yield of the display panel 10.

Figure 22:
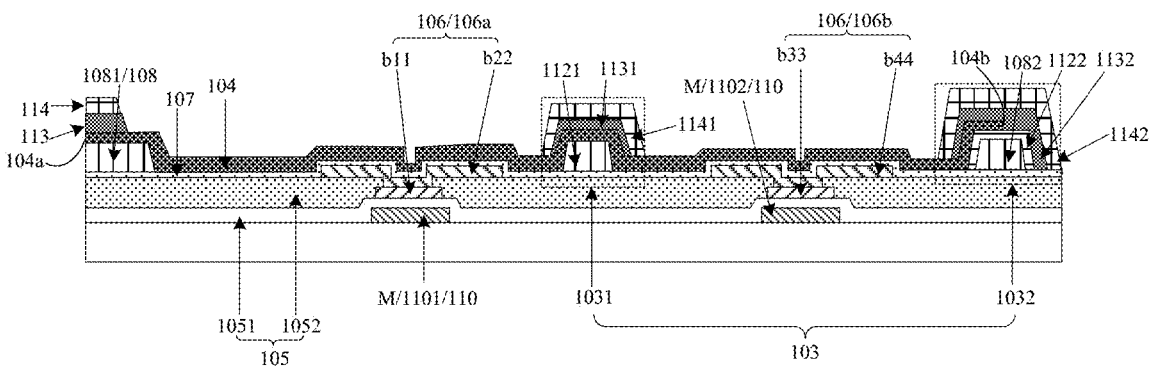
FIG. 22 is a partial sectional view of yet another display panel in a peripheral region according to some embodiments of the present disclosure.

Third solution, referring to FIG. 22, the protection layer M is an active layer 110 disposed between the base substrate 101 and the first metal layer. The plurality of first active patterns 1101 included in the active layer 110 are the first protection patterns, and the plurality of second active patterns 1102 included in the active layer 110 are the second protection patterns. The orthographic projection of the first active pattern 1101 on the base substrate 101 covers the orthographic projection of the first via hole c1 on the base substrate 101, and the orthographic projection of the second active pattern 1102 on the base substrate 101 covers the orthographic projection of the second via hole c2 on the base substrate 101.

In this solution of the embodiments of the present disclosure, since the active layer 110 is disposed on the side of the first metal layer close to the base substrate 101, by providing the first active pattern 1101 at the first via hole c1 and providing the second active pattern 1102 at the second via hole c2, the distance between the first circuit sub-pattern b11 and the second circuit sub-pattern b22 which are disposed on the side of the first active pattern 1101 away from the base substrate 101 is relatively close, and the distance between the third circuit sub-pattern b33 and the fourth circuit sub-pattern b44 which are disposed on the side of the second active pattern 1102 away from the base substrate 101 is relatively close, and thus the first insulating layer 105 is relatively thin at the positions of the first circuit sub-pattern b11 and the second circuit sub-pattern b22 and at the positions of the third circuit sub-pattern b33 and the fourth circuit sub-pattern b44. Therefore, the depths of the first via hole c1 and the second via hole c2 formed in the first insulating layer 105 are reduced. Since the first via hole c1 and the second via hole c2 in the first insulating layer 105 have a small depth, the degree of collection of the etching solution can be reduced, and the probability of over-etching the second insulating layer 107 at the first via hole c1 and the second via hole c2 is reduced, thereby preventing the connecting structure 104 from being short-circuited with the second circuit sub-pattern b22 and the fourth circuit sub-pattern b44. That is, there is no short circuit risk at the first via hole c1 and the second via hole c2, thereby ensuring the yield of the display panel.

It should be noted that in the third solution, the first insulating layer 105 includes a first sub-insulating layer 1051 and a second sub-insulating layer 1052. The first sub-insulating layer 1051 is disposed between the active layer and the first metal layer, and the second sub-insulating layer 1052 is disposed between the first metal layer and the second metal layer.

Figure 23:
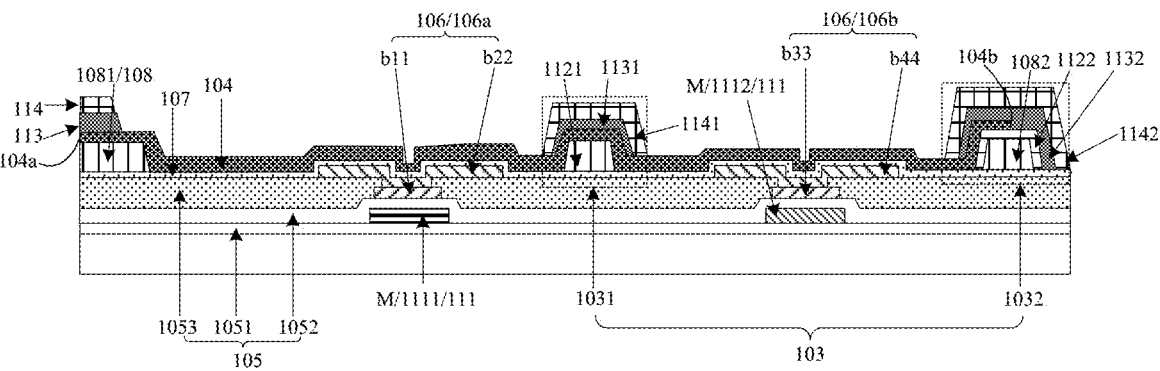
FIG. 23 is a partial sectional view of yet another display panel in a peripheral region according to some embodiments of the present disclosure.

Fourth solution, referring to FIG. 23, the protection layer M is a light-shielding layer 111 disposed between the base substrate 101 and the first metal layer. The plurality of first light-shielding patterns 1111 included in the light-shielding layer 111 are the first protection patterns, and the plurality of second light-shielding patterns 1112 included in the light-shielding layer 111 are the second protection patterns. The orthographic projection of the first light-shielding pattern 1111 on the base substrate 101 covers the orthographic projection of the first via hole c1 on the base substrate 101, and the orthographic projection of the second light-shielding pattern 1112 on the base substrate 101 covers the orthographic projection of the second via hole c2 on the base substrate 101.

In this solution of the embodiments of the present disclosure, since the light-shielding layer 111 is disposed on the side of the first metal layer close to the base substrate 101, by providing the first light-shielding pattern 1111 at the first via hole c1 and providing the second light-shielding pattern 1112 at the second via hole c2, the distance between the first circuit sub-pattern b11 and the second circuit sub-pattern b22 which are disposed on the side of the first light-shielding pattern 1111 away from the base substrate 101 is relatively close, and the distance between the third circuit sub-pattern b33 and the fourth circuit sub-pattern b44 which are disposed on the side of the second light-shielding pattern 1112 away from the base substrate 101 is relatively close, and thus the first insulating layer 105 is relatively thin at the positions of the first circuit sub-pattern b11 and the second circuit sub-pattern b22 and at the positions of the third circuit sub-pattern b33 and the fourth circuit sub-pattern b44. Therefore, the depths of the first via hole c1 and the second via hole c2 formed in the first insulating layer 105 are reduced. Since the first via hole c1 and the second via hole c2 in the first insulating layer 105 have a small depth, the degree of collection of the etching solution can be reduced, and the probability of over-etching the second insulating layer 107 at the first via hole c1 and the second via hole c2 is reduced, thereby preventing the connecting structure 104 from being short-circuited with the second circuit sub-pattern and the fourth circuit sub-pattern. That is, there is no short circuit risk at the first via hole c1 and the second via hole c2, thereby ensuring the yield of the display panel.

It should be noted that in the fourth solution, the first insulating layer 105 includes a first sub-insulating layer 1051, a second sub-insulating layer 1052 and a third sub-insulating layer 1053. The first sub-insulating layer 1051 is disposed between the base substrate 101 and the light-shielding layer 111, the second sub-insulating layer 1052 is disposed between the light-shielding layer 111 and the first metal layer, and the third sub-insulating layer 1053 is disposed between the first metal layer and the second metal layer.

In the embodiments of the present disclosure, a difference value obtained by subtracting the area of the orthographic projection of the first via hole c1 on the base substrate 101 from the area of the orthographic projection of the first protection pattern on the base substrate 101 ranges from 1 $\mu m^2$ to 50 $\mu m^2$. By making the first protection pattern slightly bigger than the first via hole c1, the connecting structure 104 and the second circuit sub-pattern b22 can be prevented from being short-circuited. A difference value obtained by subtracting the area of the orthographic projection of the second via hole c2 on the base substrate 101 from the area of the orthographic projection of the second protection pattern on the base substrate 101 ranges from 1 $\mu m^2$ to 50 $\mu m^2$. By making the second protection pattern slightly bigger than the second via hole c2, the connecting structure 104 and the fourth circuit sub-pattern b44 can be prevented from being short-circuited.

In addition, in order to reduce the difficulty of preparing the mask used for preparing the protection layer M, the setting density of the protection patterns needs to be reduced. For example, a plurality of first via holes c1 correspond to one first protection pattern, and a plurality of second via holes c2 correspond to one second protection pattern (that is, the orthographic projection of each first protection pattern on the base substrate 101 covers the orthographic projections of a plurality of first via holes c1 on the base substrate 101, and the number of the first protection patterns is less than the number of the first via holes c1, the orthographic projection of each second protection pattern on the base substrate 101 covers the orthographic projections of a plurality of second via holes c2 on the base substrate 101, and the number of the second protection patterns is less than the number of the second via holes c2). In some embodiments, the shape of the first protection pattern is adjusted based on the design of the first via hole c1, and the shape of the second protection pattern is adjusted based on the design of the second via hole c2. For example, the first protection pattern and the second protection pattern are designed to be strip-shaped or in other shapes, and the shapes of the protection patterns are not limited in the embodiments of the present disclosure.

In some embodiments, the plurality of first via holes c1 include a plurality of target first via holes, and the orthographic projections of the plurality of target first via holes on the base substrate 101 are covered by the orthographic projection of the same first protection pattern on the base substrate 101. If the spacing between any target first via hole and another target first via hole of the plurality of target first via holes is less than 4 $\mu m$, it is considered that the spacing between the two target first via holes is small, and the two target first via holes are covered by one first protection pattern. The plurality of second via holes c2 include a plurality of target second via holes, and the orthographic projections of the plurality of target second via holes on the base substrate 101 are covered by the orthographic projection of the same second protection pattern on the base substrate 101. If the spacing between any target second via hole and another target second via hole of the plurality of target second via holes is less than 4 $\mu m$, it is considered that the spacing between the two target second via holes is small, and the two target second via holes are covered by one second protection pattern.

In summary, the embodiments of the present disclosure provide a display panel including a base substrate, a plurality of pixel units, a barrier structure, a connecting structure, a first insulating layer, a circuit structure, a second insulating layer, a third insulating layer and a protection layer. The first insulating layer is disposed between the first circuit sub-pattern and the second circuit sub-pattern of the first circuit structure and is provided with a first via hole, and the first circuit sub-pattern and the second circuit sub-pattern are electrically connected through the first via hole. Since the orthographic projection of the third insulating layer on the base substrate is not overlapped with the orthographic projection of the first via hole on the base substrate, by making the protection pattern of the protection layer cover the first via hole, the second insulating layer at the via hole can be prevented from being over-etched, or even if the second insulating layer at the via hole is over-etched, the connecting structure and the second circuit sub-pattern of the first circuit structure can be prevented from being short-circuited, thereby ensuring the yield of the display panel.

Other related descriptions about the display panel provided by the embodiments of the present disclosure are the same as those of the display panel described in the foregoing embodiments. Therefore, for the purpose of brevity, details are not described herein again.

Figure 24:
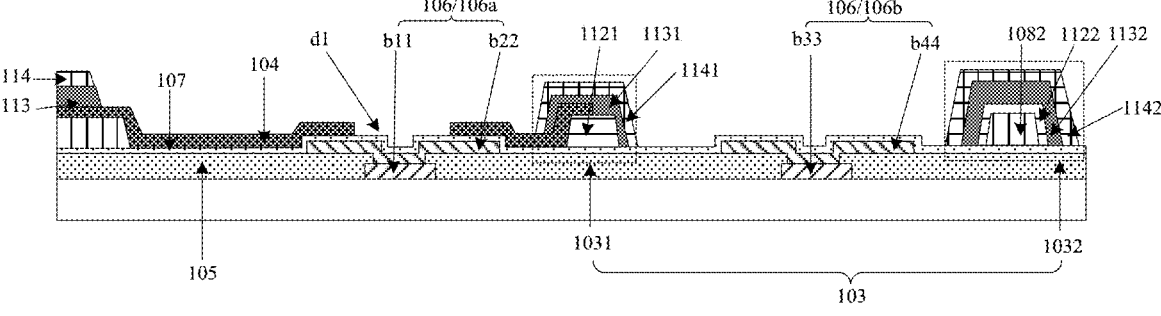
FIG. 24 is a partial sectional view of yet another display panel in a peripheral region according to some embodiments of the present disclosure.

FIG. 24 is a partial sectional view of yet another display panel in a peripheral region according to some embodiments of the present disclosure. Referring to FIG. 24, the display panel 10 includes a base substrate 101, a plurality of pixel units (not shown in FIG. 24, please refer to FIG. 1), a barrier structure 103, a connecting structure 104, a first insulating layer 105, a circuit structure 106, a second insulating layer 107, and a third insulating layer 108.

With reference to FIG. 1, FIG. 3 and FIG. 24, the plurality of pixel units 102 are disposed in the display region 101a, and the barrier structure 103, the connecting structure 104 and the circuit structure 106 are disposed in the peripheral region 101b.

Referring to FIG. 4, the pixel unit 102 includes a light-emitting unit 1021. The light-emitting unit 1021 includes a first electrode layer a1, a light-emitting layer a2 and a second electrode layer a3 stacked in sequence. For example, the first electrode layer a1 is an anode layer, and the second electrode layer a3 is a cathode layer.

With reference to FIG. 1, FIG. 3 and FIG. 24, the barrier structure 103 surrounds the plurality of pixel units 102. The edge away from the display region 101a of the orthographic projection of the connecting structure 104 on the base substrate 101 is closer to the display region 101a than the edge away from the display region 101a of the orthographic projection of the barrier structure 103 on the base substrate 101 is. The connecting structure 104 and the first electrode layer a1 are disposed in the same layer and are spaced apart from each other, and the connecting structure 104 is electrically connected to the second electrode layer a3. That is, the connecting structure 104 and the first electrode layer a1 are made of the same material and are manufactured by a single patterning process. The signal transmitted by the connecting structure 104 is the same as the signal transmitted by the second electrode layer a3.

Referring to FIG. 24, the circuit structure 106 is disposed in the peripheral region 101b, and the circuit structure 106 includes a first circuit structure 106a. The first circuit structure 106a includes a first circuit sub-pattern b11 and a second circuit sub-pattern b22. The first circuit sub-pattern b11 is disposed in the first metal layer, and the second circuit sub-pattern b22 is disposed in the second metal layer. The first insulating layer 105 in the display panel 10 is disposed between the first metal layer and the second metal layer. A via hole (including the first via hole c1) is formed in the portion of the first insulating layer 105 which is disposed in the peripheral region 101b, and the first circuit sub-pattern b11 and the second circuit sub-pattern b22 are electrically connected to each other through the first via hole c1. The second insulating layer 107 is disposed on the side of the second metal layer away from the base substrate 101, and is configured to insulate the second circuit sub-pattern b22 in the second metal layer from the connecting structure 104 which is disposed in the same layer as the first electrode layer a1.

In the embodiments of the present disclosure, the third insulating layer 108 includes a body pattern 1081 disposed in the display region 101a and the peripheral region 101b, and the body pattern 1081 includes a third side surface 1081a disposed in the peripheral region 101b. The orthographic projection of the third side surface 1081a on the base substrate 101 is between the barrier structure 103 and the display region 101a. That is, the orthographic projection of the body pattern 1081 on the base substrate 101 is not overlapped with the orthographic projection of the first circuit structure 106a on the base substrate 101.

Therefore, in order to prevent the connecting structure 104 and the second circuit sub-pattern b22 of the first circuit structure 106a from being short-circuited, the connecting structure 104 is provided with a plurality of openings d1, and the orthographic projection of the opening d1 on the base substrate 101 covers the orthographic projection of the first via hole c1 on the base substrate 101, that is, the orthographic projection of the connecting structure 104 on the base substrate 101 is not overlapped with the orthographic projection of the first via hole c1 on the base substrate 101. In this way, even if the second insulating layer 107 at the first via hole is over-etched, the connecting structure 104 and the second circuit sub-pattern b22 of the first circuit structure 106 can be prevented from being short-circuited, thereby ensuring the yield of the display panel 10.

In summary, the embodiments of the present disclosure provide a display panel, including a base substrate, a plurality of pixel units, a barrier structure, a connecting structure, a first insulating layer, a circuit structure, a second insulating layer, a third insulating layer, and a protection layer. The first insulating layer is disposed between the first circuit sub-pattern and the second circuit sub-pattern of the first circuit structure and is provided with a first via hole, and the first circuit sub-pattern and the second circuit sub-pattern are electrically connected through the first via hole. Since the orthographic projection of the opening in the connecting structure on the base substrate covers the orthographic projection of the first via hole on the base substrate, even if the second insulating layer at the first via hole is over-etched, the connecting structure and the second circuit sub-pattern of the first circuit structure can be prevented from being short-circuited, thereby ensuring the yield of the display panel.

As an optional implementation, referring to FIG. 24, the connecting structure 104 has a first side surface 104a and a second side surface 104b opposite to each other, and the first side surface 104a is closer to the plurality of pixel units 102 than the second side surface 104b is. The orthographic projection of the second side surface 104b on the base substrate 101 is within the orthographic projection of the first barrier dam 1031 on the base substrate 101, and the orthographic projection of the connecting structure 104 on the base substrate 101 is not overlapped with the orthographic projection of the second barrier dam 1032 on the base substrate 101. That is, the connecting structure 104 is disposed in a region between the first barrier dam 1031 and the display region 101a, but is not disposed in a region between the first barrier dam 1031 and the second barrier dam 1032.

In this implementation, since the orthographic projection of the second side surface 104b, (boundary) of the connecting structure 104 on the base substrate 101 is within the orthographic projection of the first barrier dam 1031 on the base substrate 101, there is a short circuit risk between the connecting structure 104 and the second circuit sub-pattern b22 of the first circuit structure 106a, but there is no short circuit risk between the connecting structure 104 and the fourth circuit sub-pattern b44 of the second circuit structure 106*b*.

In addition, in the embodiments of the present disclosure, since the orthographic projection of the opening d1 in the connecting structure 104 on the base substrate 101 covers the first via hole c1, the orthographic projection of the connecting structure 104 on the base substrate 101 is not overlapped with the orthographic projection of the second circuit sub-pattern b22 on the base substrate. Therefore, even if the second insulating layer 107 at the first via hole c1 is over-etched, the connecting structure 104 and the second circuit sub-pattern b22 of the first circuit structure 106*a* can be prevented from being short-circuited, thereby ensuring the yield of the display panel 10.

Figure 25:
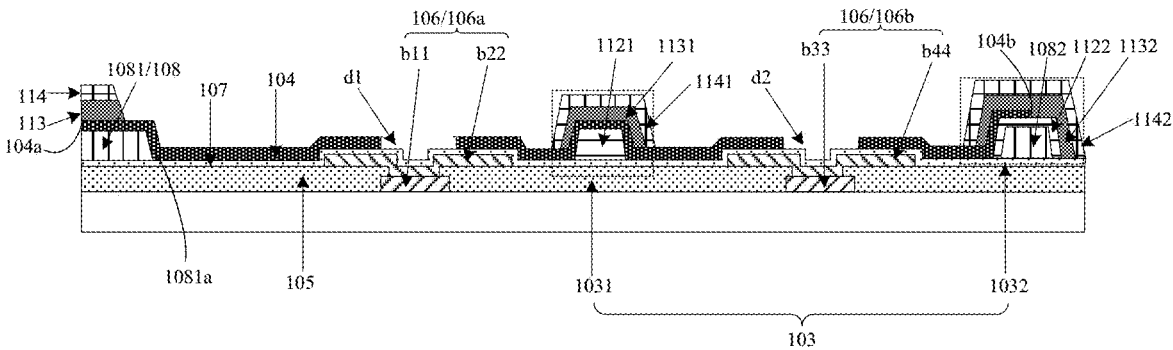
FIG. 25 is a partial sectional view of yet another display panel in a peripheral region according to some embodiments of the present disclosure.
Figure 26:
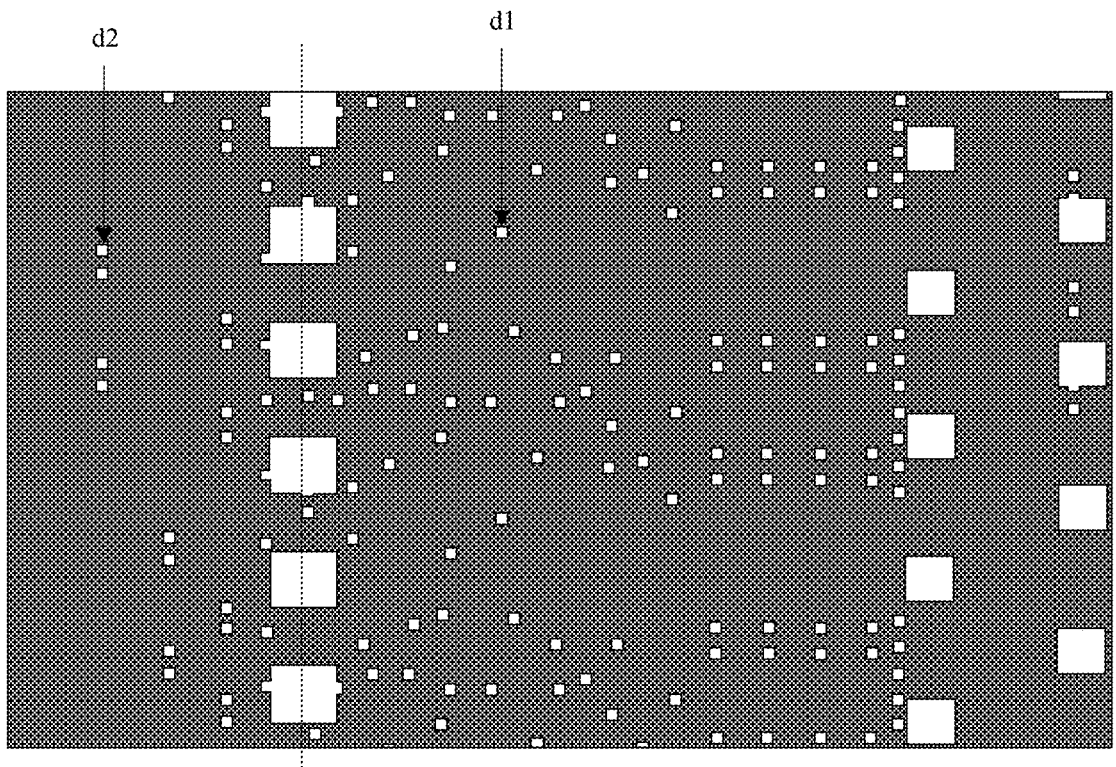
FIG. 26 is a partial schematic diagram of a connecting structure in a peripheral region according to some embodiments of the present disclosure.
Figure 27:
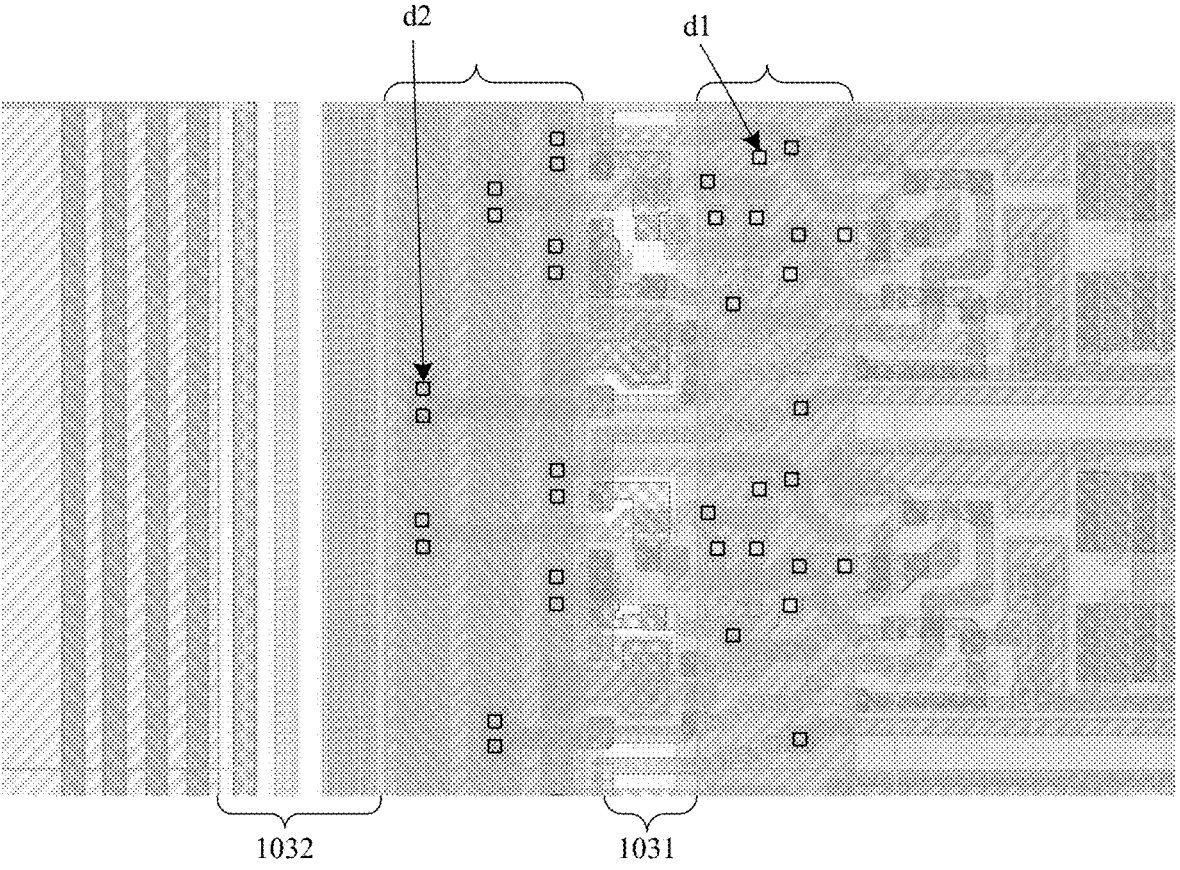
FIG. 27 is a partial schematic diagram of another display panel in a peripheral region according to some embodiments of the present disclosure.

As another optional implementation, referring to FIG. 25 to FIG. 27, the connecting structure 104 has a first side surface 104*a* and a second side surface 104*b* opposite to each other, and the first side surface 104*a* is closer to the plurality of pixel units 102 than the second side surface 104*b* is. The orthographic projection of the second side surface 104*b* on the base substrate 101 is within the orthographic projection of the second barrier dam 1032 on the base substrate 101, and the orthographic projection of the con- necting structure 104 on the base substrate 101 is overlapped with the orthographic projection of the first barrier dam 1031 on the base substrate 101. That is, the connecting structure 104 is disposed in a region between the first barrier dam 1031 and the display region 101*a*, and is also disposed in a region between the first barrier dam 1031 and the second barrier dam 1032.

In this implementation, since the orthographic projection of the second side surface 104*b* (boundary) of the connect- ing structure 104 on the base substrate 101 is within the orthographic projection of the second barrier dam 1032 on the base substrate 101, there is a short circuit risk between the connecting structure 104 and the second circuit sub- pattern b22 of the first circuit structure 106*a* and between the connecting structure 104 and the fourth circuit sub-pattern b44 of the second circuit structure 106*b*. Thus, in order to prevent the connecting structure 104 from being short- circuited with the second circuit sub-pattern b22 of the first circuit structure 106*a* and the fourth circuit sub-pattern b44 of the second circuit structure 106*b*, the openings in the connecting structure 104 include a first opening d1 and a second opening d2. The orthographic projection of the first opening d1 on the base substrate 101 covers the ortho- graphic projection of the first via hole c1 on the base substrate 101, and the orthographic projection of the second opening d2 on the base substrate 101 covers the ortho- graphic projection of the second via hole c2 on the base substrate 101.

Referring to FIG. 26 and FIG. 27, the connecting structure 104 includes a plurality of first openings d1 and a plurality of second openings d2. In FIG. 26, the dotted line is a dividing line, the smaller openings on the left side of the dividing line are the second openings d2, and the smaller openings on the right side of the dividing line are the first openings d1. In addition, the larger openings in the connect- ing structure 104 are exhaust holes. The positions indicated by the two brackets which are not labeled in FIG. 27 are regions of the third insulating layer 108 which are exca- vated. It can be seen that the plurality of first openings d1 and the plurality of second openings d2 formed in the connecting structure 104 are disposed in the regions of the third insulating layer 108 which are excavated.

The orthographic projection of the first opening d1 on the base substrate 101 covers the orthographic projection of the first via hole c1 on the base substrate 101. The orthographic projection of the second opening d2 on the base substrate 101 covers the orthographic projection of the second via hole c2 on the base substrate 101. Since the connecting structure 104 is provided with the first opening d1 at the first via hole c1 and provided with the second opening d2 at the second via hole c2, even if the second insulating layer 107 at the first via hole c1 and the second via hole c2 is over-etched (e.g., the second circuit sub-pattern b22 of the first circuit structure 106*a* and the fourth circuit sub-pattern b44 of the second circuit structure 106*b* are exposed due to the over-etching of the second insulating layer 107), the connecting structure 104 can be prevented from being short-circuited with the second circuit sub-pattern b22 and the fourth circuit sub-pattern b44, thereby ensuring the yield of the display panel 10.

In some embodiments, a difference value obtained by subtracting the area of the orthographic projection of the first via hole c1 on the base substrate 101 from the area of the orthographic projection of the first opening d1 on the base substrate 101 ranges from 1 $\mu m^2$ to 50 $\mu m^2$. A difference value obtained by subtracting the area of the orthographic projection of the second via hole c2 on the base substrate 101 from the area of the orthographic projection of the second opening d2 on the base substrate 101 ranges from 1 $\mu m^2$ to 50 $\mu m^2$.

By making the first opening d1 slightly bigger than the first via hole c1, it is further ensured that the connecting structure 104 and the second circuit sub-pattern b22 are not short-circuited. Moreover, by making the second opening d2 slightly bigger than the second via hole c2, it is further ensured that the connecting structure 104 and the fourth circuit sub-pattern b44 are not short-circuited.

In addition, the hole density of the first via holes c1 and the hole density of the second via holes c2 in the display panel 10 are related to the specific design of the GOA circuit in the display panel. In the case that the hole density of the first via holes c1 or the hole density of the second via holes c2 is low, even if each first via hole c1 corresponds to one first opening d1, and each second via hole c2 corresponds to one second opening d2, the density of the first openings d1 or the density of the second openings d2 will not be too high. In this case, it will not be too difficult to prepare the mask used for preparing the connecting structure 104. However, in the case that the hole density of the first via holes c1 or the hole density of the second via holes c2 is high, if each first via hole c1 or each second via hole c2 corresponds to one opening, the density of the openings will be too high, and it will be difficult to prepare the mask used for preparing the connecting structure 104. In this case, in order to reduce the density of the openings, a plurality of first via holes c1 correspond to one first opening d1, and a plurality of second via holes c2 correspond to one second opening d2. In some embodiments, the shape of the first opening d1 is adjusted based on the design of the first via hole c1, and the shape of the second opening d2 is adjusted based on the design of the second via hole c2. For example, the shapes of the first opening d1 and the second opening d2 are adjusted to be strip-shaped or in other shapes, and the shapes of the openings are not limited in the embodiments of the present disclosure.

In some embodiments, the plurality of first via holes c1 include a plurality of target first via holes, and the ortho- graphic projections of the plurality of target first via holes on the base substrate 101 are covered by the orthographic projection of the same first opening d1 on the base substrate 101. If the spacing between any target first via hole and another target first via hole of the plurality of target first via holes is less than 4 μm, it is considered that the spacing between the two target first via holes is small, and the two target first via holes are covered by one first opening d1. Correspondingly, the plurality of second via holes c2 include a plurality of target second via holes, and the orthographic projections of the plurality of target second via holes on the base substrate 101 are covered by the orthographic projection of the same second opening d2 on the base substrate 101. If the spacing between any target second via hole and another target second via hole of the plurality of target second via holes is less than 4 μm, it is considered that the spacing between the two target second via holes is small, and the two target second via holes are covered by one second opening d2.

In summary, the embodiments of the present disclosure provide a display panel, including a base substrate, a plurality of pixel units, a barrier structure, a connecting structure, a first insulating layer, a circuit structure, a second insulating layer, a third insulating layer, and a protection layer. The first insulating layer is disposed between the first circuit sub-pattern and the second circuit sub-pattern of the first circuit structure and is provided with a first via hole, and the first circuit sub-pattern and the second circuit sub-pattern are electrically connected through the first via hole. Since the orthographic projection of the opening in the connecting structure on the base substrate covers the orthographic projection of the first via hole on the base substrate, even if the second insulating layer at the first via hole is over-etched, the connecting structure and the second circuit sub-pattern of the first circuit structure can be prevented from being short-circuited, thereby ensuring the yield of the display panel.

Other related descriptions about the display panel provided by the embodiments of the present disclosure are the same as those of the display panel described in the foregoing embodiments. Therefore, for the purpose of brevity: details are not described herein again.

Figure 28:
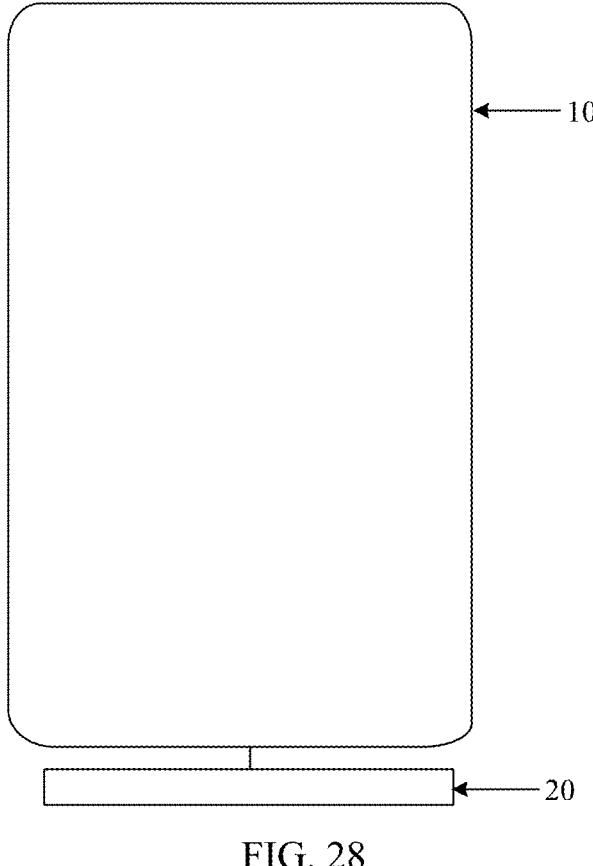
FIG. 28 is a schematic structural diagram of a display device according to some embodiments of the present disclosure.

FIG. 28 is a schematic structural diagram of a display device according to some embodiments of the present disclosure. Referring to FIG. 28, the display device includes a power supply assembly 20 and a display panel 10 provided in the foregoing embodiments. The power supply assembly 20 is configured to supply power to the display panel 10.

In some embodiments, the display device is any product or component having a display function, such as an OLED display device, a liquid crystal display device, an electronic paper, a mobile phone a tablet computer, a television, a display, a notebook computer, a digital photo frame, and a navigator.

Since the display device has substantially the same technical effects as the display panel described in the foregoing embodiments. Therefore, for the purpose of brevity, the technical effects of the display device are not repeated herein.

It will be understood that although the terms such as first and second herein may be used to describe various elements, components, regions, layers, and/or portions, these elements, components, regions, layers, and/or portions should not be limited by these terms. These terms are used to distinguish one element, component, region, layer or portion from another region, layer or portion. Accordingly, the first element, component, region, layer or portion discussed above may be referred to as the second element, component, region, layer or portion without departing from the teachings of the present disclosure.

Spatially relative terms such as "under," "on," "left," and "right" herein may be used to describe the relationship between one element or feature and another element(s) or feature(s) as shown in the figures for ease of description. It will be understood that these spatially relative terms are intended to encompass different orientations of the devices in use or operation in addition to the orientations depicted in the figures. For example, if a device in the figure is turned upside down, the elements described as being "under other elements or features" will be oriented "on" the other elements or features. Thus, the exemplary term "under" may encompass the orientations of being on and under. The devices may be oriented in other ways (rotated 90 degrees or others) and the spatially relative descriptors used herein are interpreted accordingly. In addition, it will also be understood that when a layer is referred to as being "between two layers", the layer may be the only layer between the two layers, or one or more intermediate layers may also be present.

The terms used herein are merely for the purpose of describing particular embodiments and are not intended to limit the present disclosure. For example, as used herein, the singular forms "a," "an," and "the" are intended to also include the plural forms, unless explicitly specified otherwise in the context. It will be further understood that the terms "comprising" and/or "including" used in this specification indicate the presence of stated features, integers, steps, operations, elements, and/or components, without excluding the presence or addition of one or more other features, integers, steps, operations, elements, components, and/or groups thereof. As used herein, the term "and/or" includes any and all combinations of one or more of the associated listed items. The specific features, structures, materials or characteristics described in this specification may be combined in any one or more embodiments or examples in a suitable manner. In addition, without contradicting each other, different embodiments or examples described in this specification and features in different embodiments or examples may be combined by those skilled in the art.

Unless otherwise defined, all terms (including technical and scientific terms) used herein have the same meaning as commonly understood by one of ordinary skill in the art to which this disclosure pertains. It will be further understood that the terms such as those defined in commonly used dictionaries should be interpreted as having meanings consistent with their meanings in the relevant field and/or the context of this specification and will not be interpreted in an idealized or overly formal sense unless expressly so defined herein.

The foregoing descriptions are merely optional embodiments of the present disclosure, and are not intended to limit the present disclosure. Any variations, equivalent substitutions, improvements and the like made within the spirit and principles of the present disclosure shall be included within the protection scope of the present disclosure.

What is claimed is:

1. A display panel, wherein the display panel comprises:
a base substrate having a display region and a peripheral region surrounding the display region;
a plurality of pixel units disposed in the display region, wherein the pixel unit comprises a light-emitting unit, the light-emitting unit comprising a first electrode layer, a light-emitting layer and a second electrode layer which are stacked in sequence;

a barrier structure disposed in the peripheral region, wherein the barrier structure surrounds the plurality of pixel units;

a connecting structure disposed in the peripheral region, wherein the connecting structure and the first electrode layer are disposed in a same layer and are spaced apart from each other, and the connecting structure is electrically connected to the second electrode layer;

a first insulating layer disposed between the first electrode layer and the base substrate, wherein a via hole is formed in a portion of the first insulating layer which is disposed in the peripheral region;

a circuit structure disposed in the peripheral region, wherein the circuit structure comprises a first circuit structure disposed in a region enclosed by the barrier structure, and the first circuit structure-comprises a first circuit sub-pattern and a second circuit sub-pattern, wherein the first circuit sub-pattern is disposed in a first metal layer, the second circuit sub-pattern is disposed in a second metal layer, the first metal layer and the second metal layer are disposed on two sides of the first insulating layer, the via hole in the first insulating layer comprises a first via hole, and the first circuit sub-pattern and the second circuit sub-pattern are electrically connected to each other through the first via hole;

a second insulating layer disposed on a side of the second metal layer away from the base substrate; and a third insulating layer disposed on a side of the second insulating layer away from the base substrate, wherein the third insulating layer comprises a body pattern disposed in the display region and the peripheral region, and the body pattern comprises a third side surface disposed in the peripheral region, wherein an orthographic projection of the third side surface on the base substrate is within an orthographic projection of the barrier structure on the base substrate, and portions of the body pattern which are disposed in the peripheral region are continuous pattern on a side of the third side surface close to the display region.

2. The display panel according to claim 1, wherein the barrier structure comprises a first barrier dam and a second barrier dam, wherein the first barrier dam is closer to the plurality of pixel units than the second barrier dam is, and a thickness of the first barrier dam is less than a thickness of the second barrier dam;

the connecting structure has a first side surface and a second side surface opposite to each other, wherein the first side surface is closer to the plurality of pixel units than the second side surface is;

wherein an orthographic projection of the second side surface on the base substrate is within an orthographic projection of the first barrier dam on the base substrate, and an orthographic projection of the connecting structure on the base substrate is not overlapped with an orthographic projection of the second barrier dam on the base substrate.

3. The display panel according to claim 2, wherein the circuit structure further comprises a second circuit structure disposed between the first barrier dam and the second barrier dam; wherein the second circuit structure comprises a third circuit sub-pattern and a fourth circuit sub-pattern, wherein the third circuit sub-pattern is disposed in the first metal layer, the fourth circuit sub-pattern is disposed in the second metal layer, the via hole in the first insulating layer comprises a second via hole, and the third circuit sub-pattern and the fourth circuit sub-pattern are electrically connected to each other through the second via hole.

4. The display panel according to claim 2, wherein the third insulating layer further comprises a first insulating pattern; and the display panel further comprises a fourth insulating layer disposed on a side of the third insulating layer away from the base substrate, the fourth insulating layer comprising a second insulating pattern and a third insulating pattern; wherein the first barrier dam at least comprises the second insulating pattern, and the second barrier dam at least comprises the first insulating pattern and the third insulating pattern which are stacked in a direction going away from the base substrate.

5. The display panel according to claim 1, wherein the barrier structure comprises a first barrier dam and a second barrier dam, wherein the first barrier dam is closer to the plurality of pixel units than the second barrier dam is, and a thickness of the first barrier dam is less than a thickness of the second barrier dam;

the connecting structure has a first side surface and a second side surface opposite to each other, and the first side surface is closer to the plurality of pixel units than the second side surface is;

wherein an orthographic projection of the second side surface on the base substrate is within an orthographic projection of the second barrier dam on the base substrate, and an orthographic projection of the connecting structure on the base substrate is overlapped with an orthographic projection of the first barrier dam on the base substrate.

6. The display panel according to claim 5, wherein the circuit structure further comprises a second circuit structure disposed between the first barrier dam and the second barrier dam; wherein the second circuit structure comprises a third circuit sub-pattern and a fourth circuit sub-pattern, the via hole in the first insulating layer comprises a second via hole, and the third circuit sub-pattern and the fourth circuit sub-pattern are electrically connected to each other through the second via hole;

the display panel further comprises: a protection layer disposed on the base substrate, wherein the protection layer comprises a plurality of protection patterns, wherein an orthographic projection of the protection pattern on the base substrate covers an orthographic projection of the second via hole on the base substrate.

7. The display panel according to claim 6, wherein the plurality of protection patterns are disposed in the third insulating layer.

8. The display panel according to claim 6, wherein the protection layer is a third metal layer disposed on a side of the second insulating layer away from the base substrate; wherein a plurality of metal patterns included in the third metal layer are the plurality of protection patterns, wherein an orthographic projection of the metal pattern on the base substrate covers the orthographic projection of the second via hole on the base substrate.

9. The display panel according to claim 6, wherein the protection layer is an active layer disposed between the base substrate and the first metal layer; wherein a plurality of active patterns included in the active layer are the plurality of protection patterns, wherein an orthographic projection of the active pattern on the base substrate covers the orthographic projection of the second via hole on the base substrate.

10. The display panel according to claim 6, wherein the protection layer is a light-shielding layer disposed between the base substrate and the first metal layer; wherein a plurality of light-shielding patterns included in the light-shielding layer are the plurality of protection patterns, wherein an orthographic projection of the light-shielding pattern on the base substrate covers the orthographic projection of the second via hole on the base substrate.

11. The display panel according to claim 6, wherein a difference value obtained by subtracting an area of the orthographic projection of the second via hole on the base substrate from an area of the orthographic projection of the protection pattern on the base substrate ranges from 1 square micron to 50 square microns.

12. The display panel according to claim 6, wherein a plurality of second via holes are defined in the first insulating layer, wherein the plurality of second via holes comprise a plurality of target second via holes, and orthographic projections of the plurality of target second via holes on the base substrate are covered by the orthographic projection of the same protection pattern on the base substrate;

wherein a spacing between any target second via hole and another target second via hole of the plurality of target second via holes is less than 4 μm.

13. The display panel according to claim 5, wherein the circuit structure further comprises a second circuit structure disposed between the first barrier dam and the second barrier dam; wherein the second circuit structure comprises a third circuit sub-pattern and a fourth circuit sub-pattern, the via hole in the first insulating layer comprises a second via hole, and the third circuit sub-pattern and the fourth circuit sub-pattern are electrically connected to each other through the second via hole;

the connecting structure is provided with a plurality of openings, wherein an orthographic projection of the opening on the base substrate covers an orthographic projection of the second via hole on the base substrate.

14. The display panel according to claim 13, wherein a difference value obtained by subtracting an area of the orthographic projection of the second via hole on the base substrate from an area of the orthographic projection of the opening on the base substrate ranges from 1 square micron to 50 square microns.

15. The display panel according to claim 13, wherein a plurality of second via holes comprise a plurality of target second via holes, and orthographic projections of the plurality of target second via holes on the base substrate are covered by the orthographic projection of the same opening on the base substrate;

wherein a spacing between any target second via hole and another target second via hole of the plurality of target second via holes is less than 4 μm.

16. The display panel according to claim 1, wherein an edge away from the display region of an orthographic projection of the connecting structure on the base substrate is closer to the display region than an edge away from the display region of the orthographic projection of the barrier structure on the base substrate is;

an orthographic projection of the body pattern on the base substrate is not overlapped with an orthographic projection of the second barrier dam on the base substrate.

17. The display panel according to claim 1, wherein the display panel further comprises: at least one first power line; wherein the at least one first power line is disposed in the peripheral region, and the at least one first power line comprises a first portion and a second portion; wherein the first portion is disposed on a side of the barrier structure away from the plurality of pixel units and is configured to receive a first power signal, and the second portion surrounds the plurality of pixel units and is electrically connected to the first portion and the connecting structure.

18. A display device, comprising: a power supply assembly and the display panel according to claim 1; wherein the power supply assembly is configured to supply power to the display panel.

19. A display panel, wherein the display panel comprises:

a base substrate having a display region and a peripheral region surrounding the display region;

a plurality of pixel units disposed in the display region, wherein the pixel unit comprises a light-emitting unit, the light-emitting unit comprising a first electrode layer, a light-emitting layer and a second electrode layer which are stacked in sequence;

a barrier structure disposed in the peripheral region, wherein the barrier structure surrounds the plurality of pixel units;

a connecting structure disposed in the peripheral region, wherein the connecting structure and the first electrode layer are disposed in a same layer and are spaced apart from each other, and the connecting structure is electrically connected to the second electrode layer;

a first insulating layer disposed between the first electrode layer and the base substrate, wherein a via hole is formed in a portion of the first insulating layer which is disposed in the peripheral region;

a circuit structure disposed in the peripheral region, wherein the circuit structure comprises a first circuit structure disposed between the barrier structure and the display region, and the first circuit structure comprises a first circuit sub-pattern and a second circuit sub-pattern, wherein the first circuit sub-pattern is disposed in a first metal layer, the second circuit sub-pattern is disposed in a second metal layer, the first metal layer and the second metal layer are disposed on two sides of the first insulating layer, the via hole in the first insulating layer comprises a first via hole, and the first circuit sub-pattern and the second circuit sub-pattern are electrically connected to each other through the first via hole;

a second insulating layer disposed on a side of the second metal layer away from the base substrate; and a third insulating layer disposed on a side of the second insulating layer away from the base substrate, wherein the third insulating layer comprises a body pattern disposed in the display region and the peripheral region, and the body pattern comprises a third side surface disposed in the peripheral region, wherein an orthographic projection of the third side surface on the base substrate is between the barrier structure and the display region; and a protection layer disposed on the base substrate, wherein the protection layer comprises a plurality of protection patterns, wherein an orthographic projection of the protection pattern on the base substrate covers an orthographic projection of the first via hole on the base substrate.

20. A display panel, wherein the display panel comprises:

a base substrate having a display region and a peripheral region surrounding the display region;

a plurality of pixel units disposed in the display region, wherein the pixel unit comprises a light-emitting unit, and the light-emitting unit comprising a first electrode layer, a light-emitting layer and a second electrode layer which are stacked in sequence;

a barrier structure disposed in the peripheral region, wherein the barrier structure surrounds the plurality of pixel units;

a connecting structure disposed in the peripheral region, wherein the connecting structure and the first electrode layer are disposed in a same layer and are spaced apart from each other, and the connecting structure is electrically connected to the second electrode layer;

a first insulating layer disposed between the first electrode layer and the base substrate, wherein a via hole is formed in a portion of the first insulating layer which is disposed in the peripheral region;

a circuit structure disposed in the peripheral region, wherein the circuit structure comprises a first circuit structure disposed between the barrier structure and the display region, and the first circuit structure comprises a first circuit sub-pattern and a second circuit sub-pattern, wherein the first circuit sub-pattern is disposed in a first metal layer, the second circuit sub-pattern is disposed in a second metal layer, the first metal layer and the second metal layer are disposed on two sides of the first insulating layer, the via hole in the first insulating layer comprises a first via hole, and the first circuit sub-pattern and the second circuit sub-pattern are electrically connected to each other through the first via hole;

a second insulating layer disposed on a side of the second metal layer away from the base substrate; and a third insulating layer disposed on a side of the second insulating layer away from the base substrate, wherein the third insulating layer comprises a body pattern disposed in the display region and the peripheral region, and the body pattern comprises a third side surface disposed in the peripheral region, wherein an orthographic projection of the third side surface on the base substrate is between the barrier structure and the display region;

wherein the connecting structure is provided with a plurality of openings, wherein an orthographic projection of the opening on the base substrate covers an orthographic projection of the first via hole on the base substrate.

* * * * *